US006944805B2

(12) United States Patent
Seki

(10) Patent No.: US 6,944,805 B2
(45) Date of Patent: Sep. 13, 2005

(54) SELF ORTHOGONAL DECODING CIRCUIT AND SELF ORTHOGONAL DECODING METHOD

(75) Inventor: Katsutoshi Seki, Tokyo (JP)

(73) Assignee: NEC Corporation, Tokyo (JP)

( * ) Notice: Subject to any disclaimer, the term of this patent is extended or adjusted under 35 U.S.C. 154(b) by 636 days.

(21) Appl. No.: 09/964,195

(22) Filed: Sep. 26, 2001

(65) Prior Publication Data

US 2002/0038444 A1 Mar. 28, 2002

(30) Foreign Application Priority Data

Sep. 27, 2000 (JP) ........................................ 2000-293231

(51) Int. Cl.[7] ............................................. H03M 13/33
(52) U.S. Cl. ....................................... 714/707; 714/793
(58) Field of Search ................................. 714/707, 793

(56) References Cited

U.S. PATENT DOCUMENTS

| 3,806,647 | A | * | 4/1974 | Dohne et al. ................ 375/281 |
| 4,404,674 | A |   | 9/1983 | Rhodes ......................... 371/43 |
| 5,398,237 | A | * | 3/1995 | Eyer et al. ................... 370/206 |
| 5,710,783 | A |   | 1/1998 | Luthi et al. .................. 371/374 |
| 6,167,552 | A | * | 12/2000 | Gagnon et al. .............. 714/793 |

FOREIGN PATENT DOCUMENTS

| EP | 0 504 905 A2 | 9/1992 |
| EP | 0 907 256 A2 | 4/1999 |
| JP | H11-327436 | 11/1999 |
| JP | 2002-508894 | 3/2002 |
| WO | WO 98/43383 | 10/1998 |

OTHER PUBLICATIONS

Gagnon et al., "Simplified Implementation of a Soft Decision Threshold Decoder", IEEE GLOBECOM '93, Dec. 1993, pp. 626–630.*
Cardinal et al., "Convolutional Self Doubly Orthogonal Codes for Iterative Decoding Without Interleaving", IEEE International Symposium on Information Theory, Aug. 1998, p. 280.*
Yuan et al., "1.2 Gbit/s Error Correcting En/Decoder for Optical Fibre Communication in 1.2 um CMOS", IEEE International Symposium on Circuits and Systems, Jun. 1991, pp. 1904–1901.*
Australian Office Action dated Mar. 12, 2004.
Hideki Imai, "Coding Theory", The Institute of Electronics, Information and Communication Engineers, pp. 274–278 (1990).
Christian Cardinal, et al., "Turbo Decoding Using Convolutional Self Doubly Orthogonal Codes", vol. 1, (1999), pp. 113–117.
Blizard R.B.et al., "An Iterative Probabilistic Threshold Decoding Technique", Proc. Of National Communications Conference, Houston, U.S.A., vol. Conf. (1972), pp. 13D–1–13D5.

* cited by examiner

*Primary Examiner*—Stephen M. Baker
(74) *Attorney, Agent, or Firm*—Scully, Scott, Murphy & Presser

(57) ABSTRACT

A self orthogonal decoding circuit and a method thereof, can be realized with simple circuit construction and can significantly improve error correction performance. The self orthogonal decoding circuit performing decoding for self orthogonal code repeats decoding for the self orthogonal code for a plurality of times.

20 Claims, 27 Drawing Sheets

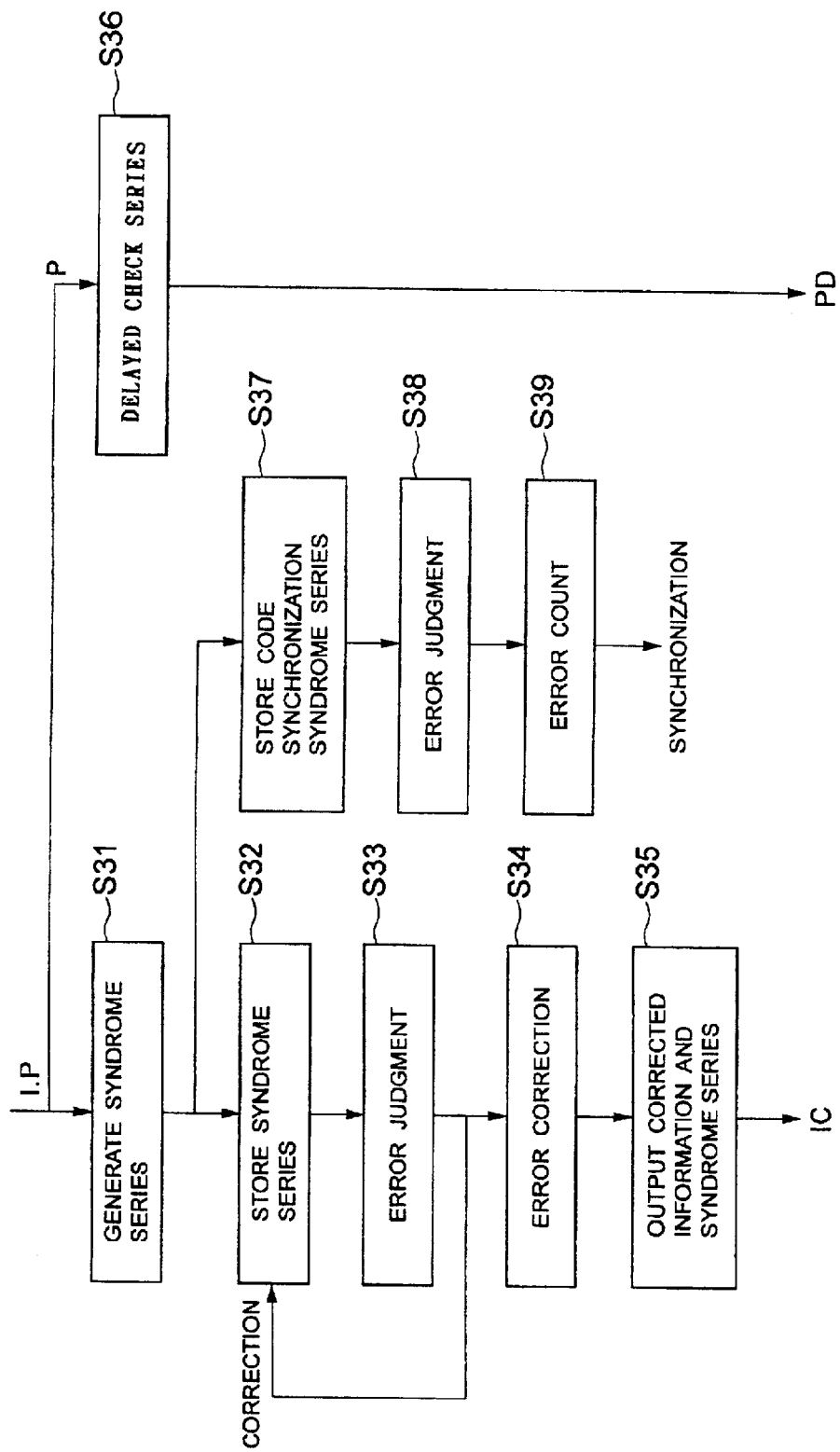

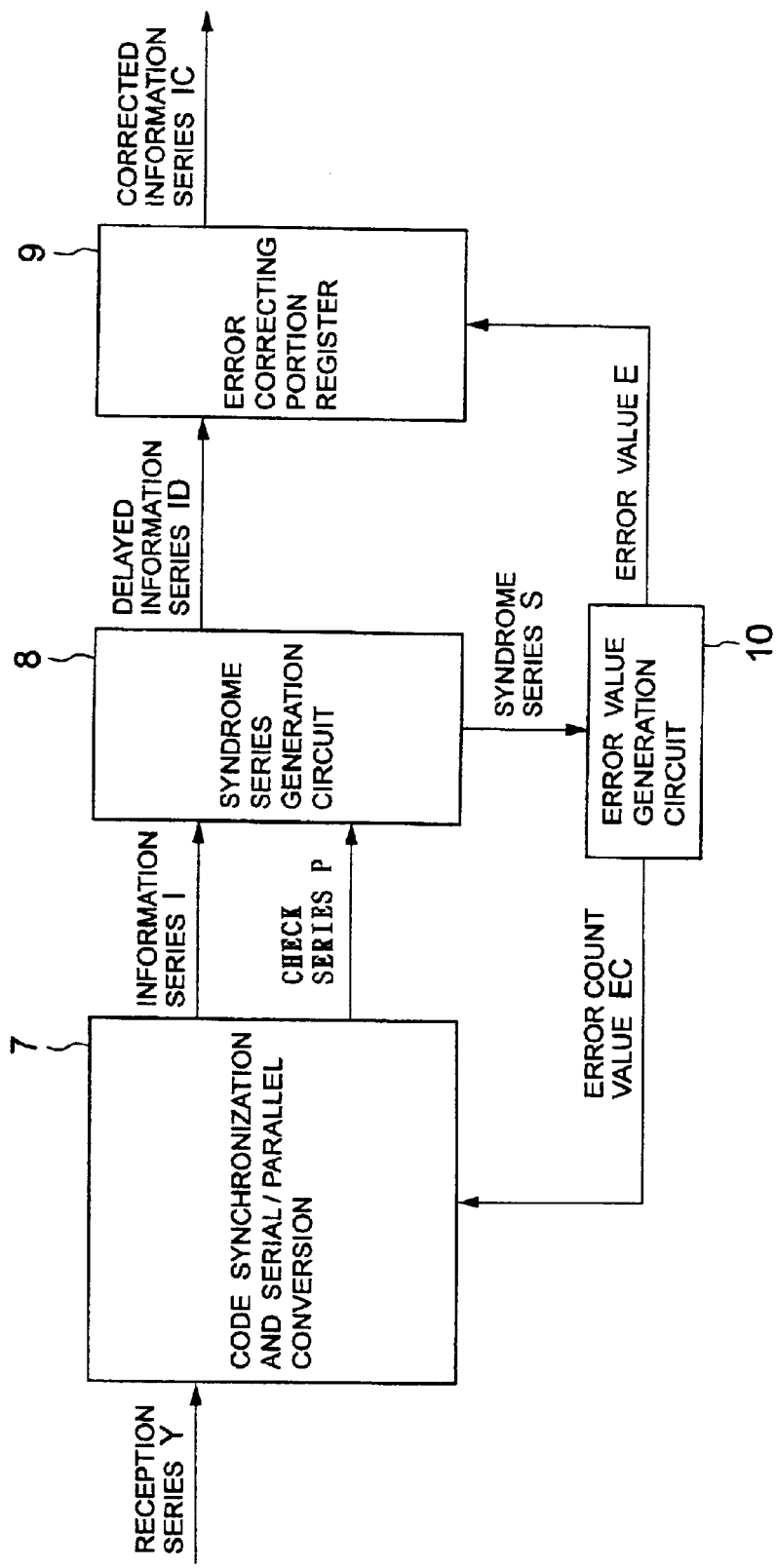

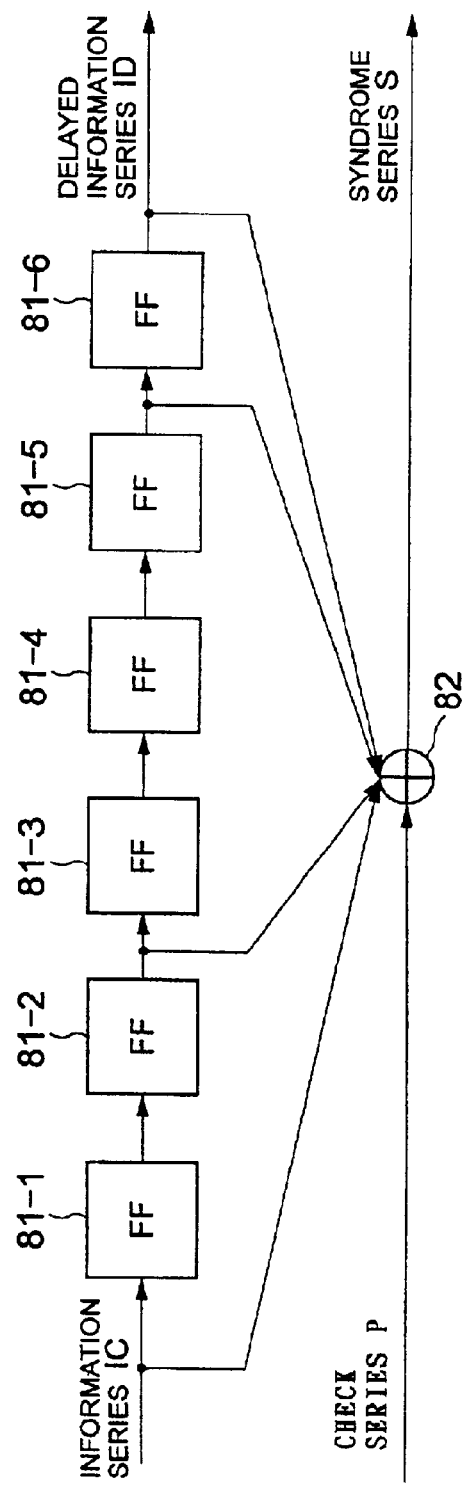

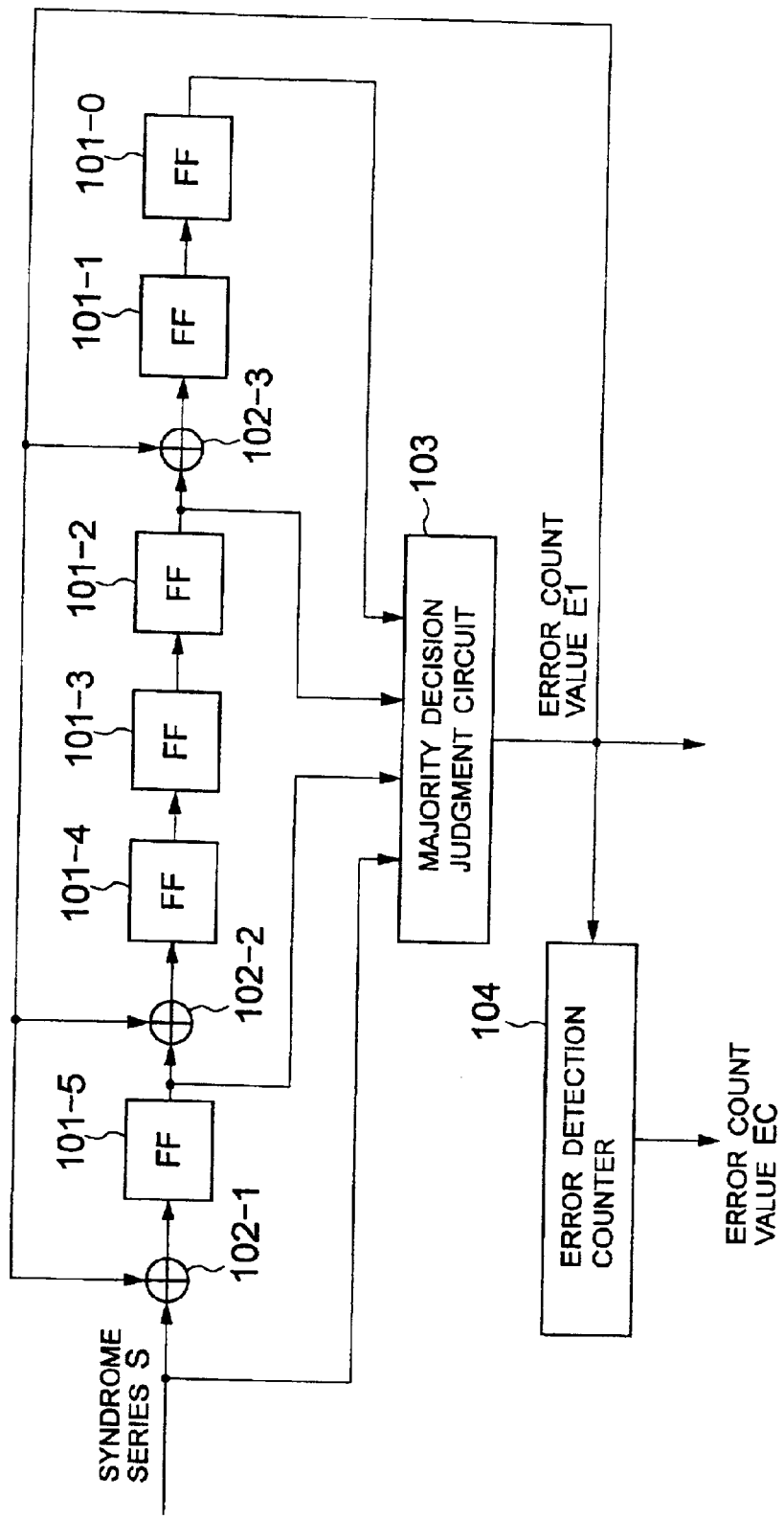

SELF ORTHOGONAL DECODING CIRCUIT AND SELF ORTHOGONAL DECODING METHOD

BACKGROUND OF THE INVENTION

1. Field of the Invention

The present invention relates generally to a self orthogonal decoding circuit and a self orthogonal decoding method. More particularly, the invention relates to a decoding method and a decoding circuit for a self orthogonal code as convolution code which is quite simple and easy to apply to systems.

2. Description of the Related Art

Self orthogonal code has been known as being quite simple and easy to apply for systems and has been widely applied in the field of satellite communication, optical communication or communication by a wire cable. However, in comparison with Viterbi decoding as most-probable decoding of the convolution code, the conventional self orthogonal code is lower in error correction performance.

A construction of the conventional decoder for self orthogonal code is illustrated in FIG. 25. In FIG. 25, there is illustrated a construction of the case of self orthogonal code in a coding ratio of 1/2. In this case, code generating polynomial expression is assumed to be:

$$G1=1+X^2+X^5+X^6 \qquad (1)$$

number of orthogonal is assumed to be four. Theoretical background of the self orthogonal code and detail of realizing method of the conventional decoder has been disclosed in Hideki Imai, "Coding Theory", The Institute of Electronics. Information and Communication Engineers, March, 1990, pp 274 to 278.

In the self orthogonal code of coding ratio 1/2, check series of the same proportion to information series is added in the encoder to generate a transmission series, in which information series and check series are arranged alternately. The transmission series is output to a line. Then a reception series Y added an error to the transmission series is input to the decoder.

The conventional self orthogonal code decoder is constructed with a code Synchronization and serial/parallel converter circuit 7, a syndrome series generation circuit 8, an error value generation circuit 10 and an error correcting portion 9.

The reception series input to the decoder is input to the code synchronization and serial/parallel converter circuit 7. The code synchronization and serial/parallel converter circuit 7 establishes synchronization of the code and performs serial/parallel conversion of the reception series Y into the information series I and the check series P to output to the syndrome series generation circuit 8.

Code synchronization is performed on the basis of an error count value EC input from the error value generation circuit 10. For example, when the error count value EC is greater than or equal to a threshold value, out of code synchronization is judged to vary a phase of the parallel signal to be output to the syndrome series generation circuit 8. The syndrome series generation circuit 8 generates a syndrome series S on the basis of the information series I and the check series P input from the code synchronization and serial/parallel converter circuit 7.

A construction of the syndrome series generation circuit 8 is shown in FIG. 26. In FIG. 26, the syndrome series generation circuit 8 is constructed with first to sixth order information series registers 81-1 to 81-6 and an exclusive OR circuit 82.

The information series I is input to the first order information series register 81 and then shifted in sequential order from the second to sixth information series shift registers 81-2 to 81-6 at every occurrence of clock. The information series I thus delayed by the first to sixth information series shift registers 81-1 to 81-6 to be output to the error correcting portion 9 as delayed information series ID.

Number of stages of the information series registers corresponding to number of orders of the generation polynomial expression. The input information series I corresponds to (0)th order of the generation polynomial expression. Data corresponding to the order of the generation polynomial expression having coefficient other than 0 and the check series P are input to the exclusive OR circuit 82.

In the shown example, the generation polynomial expression has coefficients other than 0 in zeroth, second, fifth and sixth order. Therefore, information series I, outputs of the second, fifth and sixth information series registers and the check series P are input to the exclusive OR circuit 82.

The exclusive OR circuit 82 takes an exclusive OR of the input signal to output it to the error value generation circuit 10 as the syndrome series S.

The error value generation circuit 10 leads an error value on the basis of the syndrome series S input from the syndrome series generation circuit 8. A construction of the error value generation circuit 10 is illustrated in FIG. 27. In FIG. 27, the error value generation circuit 10 is constructed with zeroth to fifth syndrome registers 101-0 to 101-5, a majority decision judgment circuit 103, an error detection counter 104 and syndrome correcting exclusive OR circuit 101-1 to 102-3. Number of order of the syndrome registers corresponds to number of order of the generation polynomial expression.

The input syndrome series S corresponds to the highest order (sixth order) of the generation polynomial expression. Data corresponding to number of order of the expression polynomial expression having the coefficient other than zero, is input to the majority decision judgment circuit 103. Assuming the number of orthogonal is J, the judgment threshold value A of the majority decision judgment circuit 103 becomes:

$$A=\lfloor J/2 \rfloor \qquad (2)$$

The majority decision judgment circuit 103 makes judgment that error is caused when number of input signals having value "1" is greater than or equal to A, "1" is output as an error value E. When the majority decision judgment circuit 103 outputs "0" as the error value E with judgment that error is not caused when number of input signals having a value "1" is less than the judgment threshold value A.

Since the generation polynomial expression in the shown example has coefficients other than zero at zeroth, second, fifth and sixth order, outputs of the zeroth, second and fifth syndrome registers 101-0, 101-2 and 101-5 and the syndrome series S are input to the majority decision judgment circuit 103. Accordingly, the majority decision judgment circuit 103 has four input signals. The majority decision judgment circuit 103 makes judgment as error being caused when number of the input signals having values "1" is greater than or equal to three to output "1" as the error value E.

The syndrome series S is shifted from higher order syndrome register to lower order syndrome register at every occurrence of clock. It has been known that when error is detected in the majority decision judgment circuit 103 influence of the error is eliminated from the syndrome series S to achieve enhancement of error correction performance. In order to eliminate influence of error from the syndrome series S, the signal input to the majority decision judgment circuit 103 is inverted the value when the error is detected and then input to the lower order syndrome register.

More particularly, inversion of the values is performed by the syndrome correcting exclusive OR circuit 102-1 to 102-3. The syndrome correcting exclusive OR circuits 102-1 to 102-3 take the syndrome series S and the outputs of the fifth and second syndrome registers 101-5 and 101-2 as first input, and take the error value E as second input. The syndrome correcting exclusive OR circuit 102-1 to 102-3 takes an exclusive OR of the first input and the second input to output the results of exclusive OR operation to the fifth, fourth and first syndrome registers 101-5, 101-4 and 101-1.

The error detection counter 104 takes an error value E as input and counts number of error detected within a given period. The counter error count value EC is output to the code synchronization and serial/parallel converter circuit 7. The error correcting portion 9 makes correction of the delayed information series ID input from the error value generation circuit 10 on the basis of the error value E input from the syndrome series generation circuit 8 to output as a corrected information series IC.

While the foregoing conventional self orthogonal decoding circuit is simple in decoding and easy to apply for systems, it holds shortcoming in lower error correction performance in comparison with Viterbi decoding as most-probable decoding of the convolution code.

SUMMARY OF THE INVENTION

The present invention has been worked out in view of the problem set forth above. It is therefore an object of the present invention to provide a self orthogonal code decoding circuit and a method thereof, which can be realized with simple circuit construction and can significantly improve error correction performance.

According to the first aspect of the present invention, a self orthogonal code decoding circuit for decoding a self orthogonal code repeats decoding for the self orthogonal code for a plurality of times.

According to the second aspect of the invention, a self orthogonal code decoding circuit for decoding a self orthogonal code on the basis of syndrome bit determined only by an error in a reception series which is generated by adding error to a transmission series which is in turn generated by parallel/serial conversion with adding an check series to an information series, comprising:

a plurality of stages of decoding circuit for repeating decoding for the self orthogonal code for a plurality of times; and check series register output provided from each of decoding circuit stage except for the decoding circuit at a final stage among the plurality of stages of decoding circuits and for inputting the check series to next stage of decoding circuit with delay.

According to the third aspect of the present invention, a self orthogonal code decoding method for decoding a self orthogonal code repeating decoding for the self orthogonal code for a plurality of times.

According to the fourth aspect of the present invention, a self orthogonal code decoding method performing decoding for self orthogonal code on the basis of syndrome bit determined only by an error in a reception series which is generated by adding error to a transmission series which is in turn generated by parallel/serial conversion with adding an check series to an information series, comprises a step of:

in each of a plurality of stages of deciding circuit for repeating decoding for the self orthogonal code for a plurality of times, the check series being input to next stage of decoding circuit with a delay except for the decoding circuit at the final stage.

Namely, in the self orthogonal code decoding circuit according to the present invention, error correction performance can be improved by repeating decoding for the self orthogonal code for a plurality of times.

More particularly, in the self orthogonal code decoding circuit according to the present invention, by employing a construction for inputting the check series to the decoding circuit in the next stage with delay by the check series register to enable decoding for a plurality of times.

On the other hand, in the plurality of stages of decoding circuits, a reception series error detection threshold value for detecting a reception series error in first decoding is set high for a reception series error only for high probability of error being corrected, and the reception series error detection value being gradually lower in successive decoding circuit stages, for error detection when there is a lower probability of error. This reduces occurrence of erroneous correction to significantly improve error correction performance.

In the preferred construction, the self orthogonal code decoding circuit may comprise means for performing code synchronization error detection by counting number of detected reception series errors and performing code synchronization on the basis of counted number of detected errors.

Also, the self orthogonal code decoding circuit may comprise code synchronization dedicated error detector circuit provided separately from the circuit for reception series error detector for detecting a sychronization on the basis of a threshold value optimized for code synchronization error detection and the threshold value of the code synchronization dedicated error detection threshold value to be lower than the reception series error detector threshold value. In such case, the self orthogonal code decoding circuit may comprise a syndrome register which shifts the syndrome bit to output to the code synchronization dedicated error detection circuit, so as not to perform reception series error on t he basis of the result of error detector by the code synchronization dedicated error detector circuit for the syndrome register.

In the alternative, each decoding circuit in the plurality stages comprises:

syndrome generation means for generating the syndrome bit;

error value generation means for generating an error value by making detection of error of the syndrome bit generated by the syndrome generation means on the basis of the reception series error detection threshold value error correcting means for correcting error of the syndrome bit on the basis of the error value generated by the error value generation means; and error detection counter for counting the errors on the basis of the error value generated by the error value generation means.

A system including an information source generating an information series, an encoder for converting the information series into a code series, and a communication path for transmitting the code series, may perform decoding for the self orthogonal code is repeated for a plurality of times. In such case, the communication path is constructed with a wired cable. The wired cable may be an optical cable. In the alternative, the communication path may be a transmission path in radio communication.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings:

FIG. 24 is a flowchart showing a decoding process in a further embodiment of the first stage decoding circuit according to the present invention;

FIG. 25 is a block diagram showing a construction of the conventional self orthogonal code decoder;

FIG. 26 is a block diagram showing a construction of the syndrome series generation circuit of FIG. 25; and FIG. 27 is a block diagram showing a construction of the error value generation circuit of FIG. 25.

DESCRIPTION OF THE PREFERRED EMBODIMENT

The present invention will be discussed hereinafter in detail in terms of the preferred embodiment of a self orthogonal code decoding circuit according to the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structure are not shown in detail in order to avoid unnecessary obscurity of the present invention.

Figure 1:
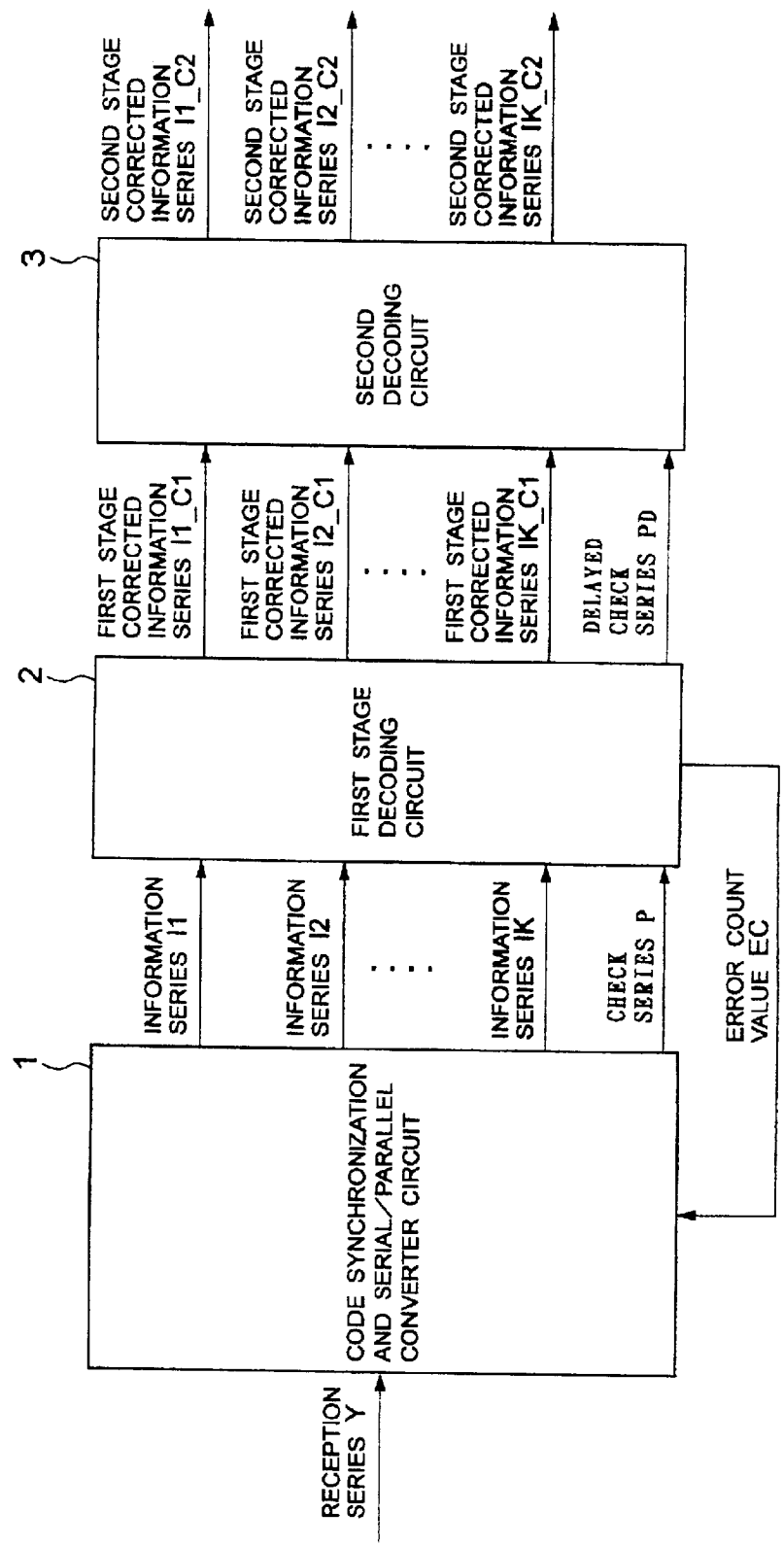
FIG. 1 is a block diagram showing a construction of the preferred embodiment of a self orthogonal code decoding circuit according to the present invention.

FIG. 1 is a block diagram showing a construction of the preferred embodiment of a self orthogonal code decoding circuit according to the present invention. In FIG. 1, the shown embodiment of self orthogonal code decoding circuit according to the present invention is constructed with a code synchronization and serial/parallel converter circuit 1, a first stage decoding circuit 2 and a second decoding circuit 3.

Here, coding ratio is assumed to be K/(K+1), number of orthogonal is J, and first to (K)th generation polynomial expressions $G_1$ to $G_1$ are as follows.

$$G_1 = x^{d_{1,1}} + x^{d_{1,2}} + \ldots + x^{d_{1,J}} \quad (3)$$

$$G_2 = x^{d_{2,1}} + x^{d_{2,2}} + \ldots + x^{d_{2,J}}$$

$$\vdots$$

$$G_K = x^{d_{K,1}} + x^{d_{K,2}} + \ldots + x^{d_{K,J}}$$

$$d_{1,1} < d_{1,2} < \ldots < d_{1,J}$$

$$d_{2,1} < d_{2,2} < \ldots < d_{2,J}$$

$$\vdots$$

$$d_{K,1} < d_{K,2} < \ldots < d_{K,J}$$

The number of orthogonal J is number of orders having coefficients, in which the generation polynomial expression is other than zero.

In the self orthogonal code of coding ratio K/(K+1), check series is added to the first to (K)th information series in not shown encoder for generating a transmission series through parallel/series conversion of (K+1) in number of parallel signals. The transmission series is output to a line. A reception series Y generated by adding an error to the transmission series is input to a decoding circuit. It should be noted that the self orthogonal code has been disclosed in Hideki Imai, "Coding Theory", The Institute of Electronics. Information and Communication Engineers, March, 1990, pp 274 to 278.

The reception series Y input to the decoding circuit is input to the code synchronization and serial/parallel converter circuit 1. The code synchronization and serial/parallel converter circuit 1 establishes code synchronization and performs serial/parallel conversion for the reception series Y to generate the information series I1 to IK and the check series to output to the first stage decoding circuit 2.

Code synchronization is performed on the basis of the error count value EC input from the first stage decoding circuit 2. For example, when the error count value EC is greater than or equal to the threshold value, judgment is made that the code synchronization is broken, the phase of the parallel signal output to the first stage decoding circuit 2 is varied.

The first stage decoding circuit 2 takes the information series I1 to IK and the check series P as inputs for performing error correction on the basis of the information series I1 to IK and the check series P for outputting first stage corrected first to (K)th information series I1_C1 to IK_C1 and a delayed check series PD to the second decoding circuit 3. The second decoding circuit 3 performs error correction for the first stage corrected first to (K)th information series I1_C1 to IK_C1 in which number of error has been decreased by the first stage decoding circuit 2 for further decreasing number of error.

Figure 2:
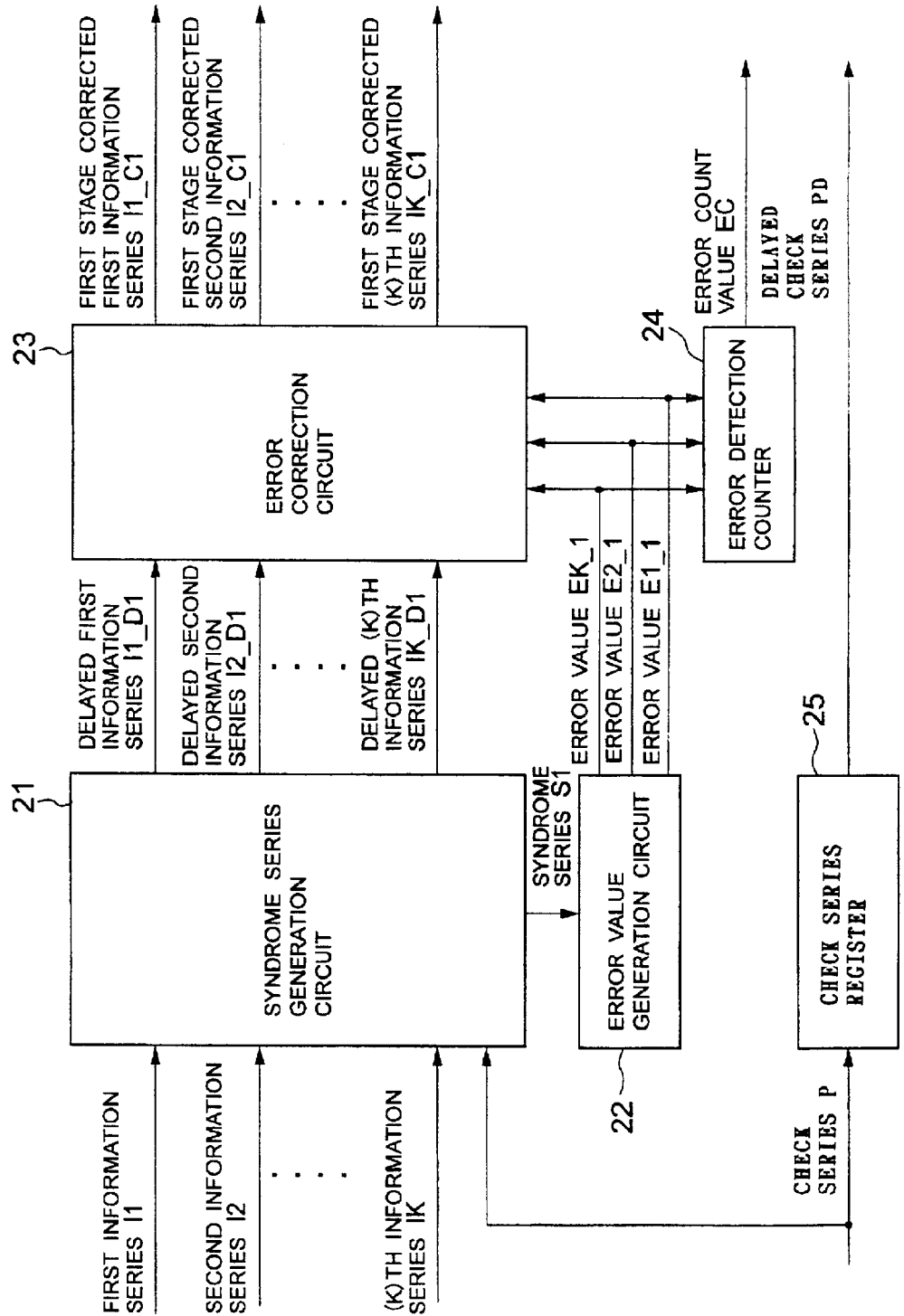
FIG. 2 is a block diagram showing a construction of a first stage decoding circuit shown in FIG. 1.

FIG. 2 is a block diagram showing a construction of the first stage decoding circuit 2 shown in FIG. 1. In FIG. 2, the first stage decoding circuit 2 is constructed with a syndrome series generation circuit 21, an error value generation circuit 22, an error correction circuit 23, an error detection counter 24 and an check series register 25.

The syndrome series generation circuit 21 generates a syndrome series S1 on the basis of the first to (K)th information series I1 to IK and the check series P input from the code synchronization and serial/parallel converter circuit 1. The error value generation circuit 22 derives an error value on the basis of the syndrome series S1 input from the syndrome series generation circuit 21.

The error detection counter 24 takes error values $E1_{13}1$ to EK_1 as input from the error value generation circuit 22 for counting number of error. The error count value EC thus counted is output to the code synchronization and serial/parallel converter circuit 1.

The error correction circuit 23 corrects delayed information series I1_D1 to IK_D1 input from the syndrome series generation circuit 21 on the basis of the error values $E1_{13}1$ to EK_1 input from the error value generation circuit 22 to output first to (K)th first stage corrected information series $I1_{13}$ C1 to IK_C1 to the second decoding circuit 3.

The check series register 25 is used for transferring the check series P to the second decoding circuit 3. Assuming that a maximum value at maximum order $d_{1\_J}$ to $d_{K\_J}$ of the first to (K)th generation polynomial expressions $G_1$ to $G_K$, is $d_{max}$, the check series register 25 is constructed with $d_{max}$ in number of shift registers. The check series P is input to the check series register 25 and is shifted at every occurrence of clock. The check series P delayed for $d_{max}$ clock is output to the second decoding circuit 3 as the delayed check series PD.

Figure 3:
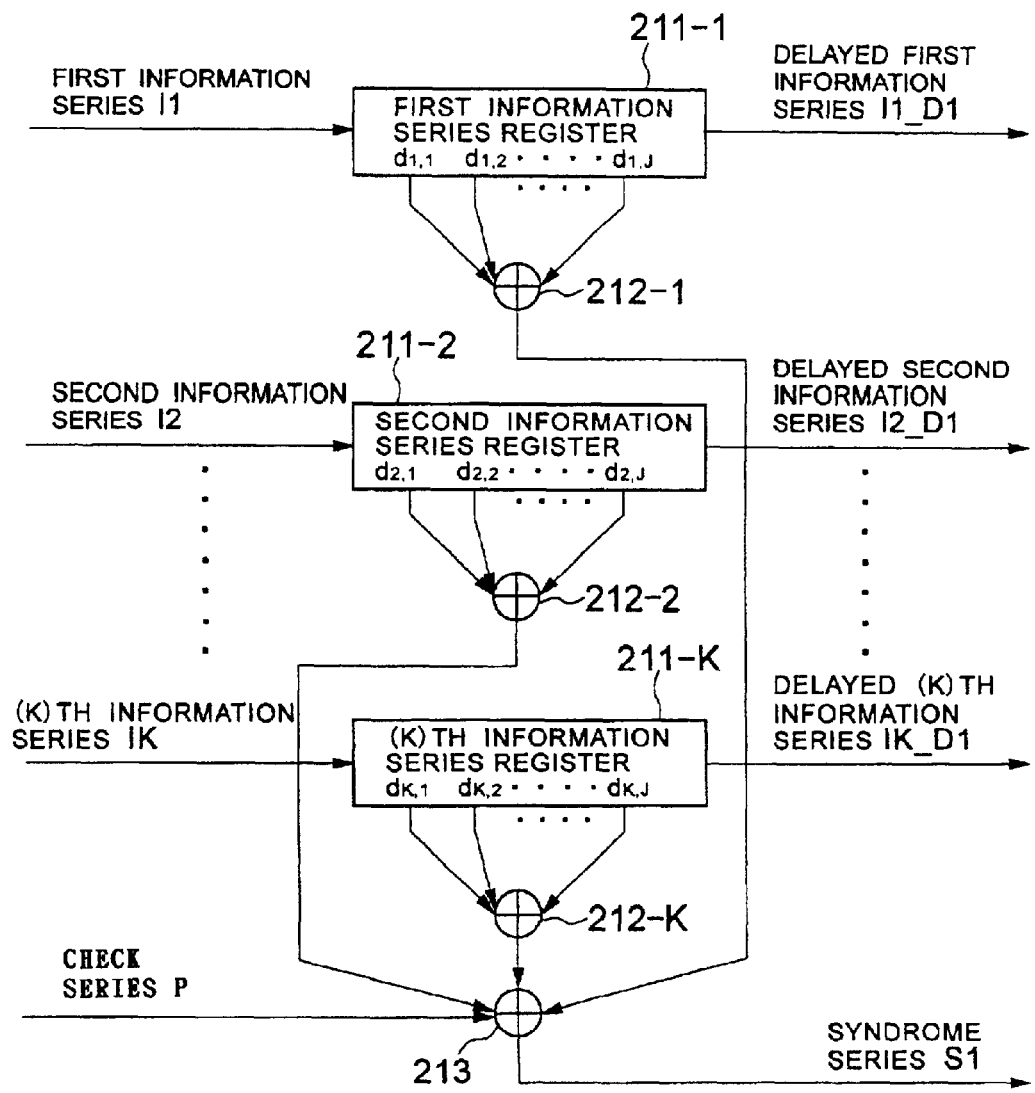
FIG. 3 is a block diagram showing a construction of a syndrome series generation circuit of FIG. 2.

FIG. 3 is a block diagram showing a construction of the syndrome series generation circuit 21 shown in FIG. 2. In FIG. 3, the syndrome series generation circuit 21 is constructed with first to (K)th information series registers 211-1 to 211-K, first to (K)th information series exclusive OR circuits 212-1 to 212-K and syndrome series generating exclusive OR circuit 213.

Assuming that the maximum value at maximum order $d_{1\_J}$ to $d_{K\_J}$ of the first to (K)th generation polynomial expressions $G_1$ to $G_K$, is $d_{max}$, each of the first to (K)th information series registers 211-1 to 211-K is constructed with $d_{max}$ in number of the shift registers. The first to (K) th information series I1 to IK are input to the first to (K)th information series registers 211-1 to 211-K and shifted at every occurrence of the clock. The first to (K)th information series I1 to IK delayed for $d_{max}$ is output to the error correction circuit 23 as first to (K)th delayed information series I1_D1 to IK_D1.

The $d_{max}$ in number of shift registers in the first to (K)th information series registers 211-1 to 211-K corresponds to number of orders of the first to (K)th generation polynomial expressions. Particularly, the output of the first stage register receiving input of the first to (K)th information series I1 to IK correspond to the first order of the generation polynomial expression. The output of the ($d_{max}$)th shift register corresponds to the ($d_{max}$)th order of the polynomial expression. The first to (K)th information series I1 to IK correspond to zeroth order of the polynomial expression.

The signals corresponding to order number of the generation polynomial expression having coefficients other than zero are input to first to (K)th information series exclusive OR circuits 212-1 to 212-K. For example, the first generation polynomial expression $G_1$ has coefficients other than zero at J in number of order number of $d_{1.1}$ to $d_{1\_J}$. Therefore, the outputs of the ($d_{1.1}$)th to ($d_{1\_J}$)th shift registers in the first information series registers 211-1 are input to the first information series exclusive OR circuit 212-1.

The first to (K)th information series exclusive OR circuits 212-1 to 212-K take exclusive OR of J in number of input signals to output the result of exclusive OR operation to the syndrome series generating exclusive OR circuit 213. The syndrome series generating exclusive OR circuit 213 takes an exclusive OR of the outputs of the first to (K)th information series exclusive OR circuits 212-1 to 212-K and the check series P to output the result of exclusive OR operation to the error value generation circuit 22 as the syndrome series S1.

Figure 4:
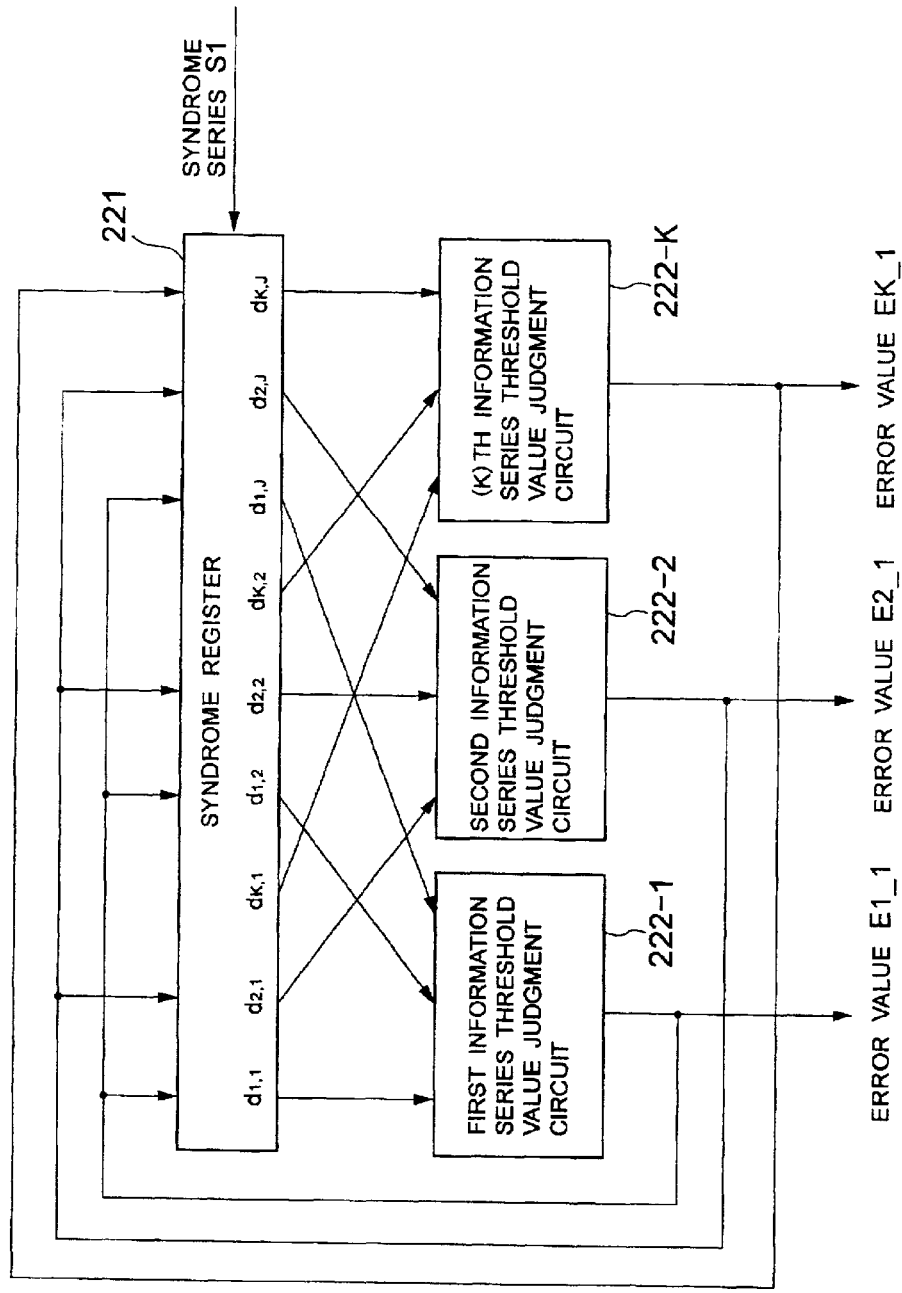
FIG. 4 is a block diagram showing a construction of an error value generation circuit of FIG. 2.

FIG. 4 is a block diagram showing a construction of the error value generation circuit 22 of FIG. 2. In FIG. 4, the error value generation circuit 22 is constructed with a syndrome register 221 and first to (K)th threshold value judgment circuits (hereinafter referred to as either "threshold value judgement circuit" or "error detection circuits") 222-1 to 222-K.

The syndrome register 221 is constructed with $d_{max}$ in number of shift registers. The syndrome series S1 is input to the syndrome register 221 and shifted at every occurrence of clock. The $d_{max}$ in number of the shift registers in the syndrome register 221 correspond to order number of the generation polynomial expression. Particularly, the output of the first stage register input the syndrome series S1 corresponds to ($d_{max}$−1) of generation polynomial expression. The output of the ($d_{max}$)th shift register corresponds to zeroth polynomial expression. The syndrome series S1 corresponds to ($d_{max}$)th generation polynomial expression.

The signals corresponding to order number of the generation polynomial expression having coefficients other than zero, are out to the threshold value generation circuit. For example, the first generation polynomial G1 has non-zero coefficients at J in order number of $d_{1\_1}$ to $d_{1\_J}$. Therefore, the outputs of the $(d_{max}-d_{1\_1})$th to $(d_{max}-d_{1\_J})$th shift registers in the syndrome register 221 are fed to the first threshold value judgment circuit 222-1.

The first to (K)th threshold value judgment circuits 222-1 to 222-K makes judgment that error is caused only when number of signals having value "1" is more than or equal to B among J in order number of input signals to output "1" as error values $E1_{13}$ 1 to EK-1. Here, B is expressed by:

$$B = \lfloor J/2 \rfloor + \alpha \qquad (4)$$

wherein $\lfloor J/2 \rfloor$ is minimum natural number not smaller than J/2, and $\alpha$ is a natural number.

When number of the signals having the value "1" is less than B, judgment is made that error is not caused to output "0" as the error values E1__1 to EK__1. For example, among the input signals of the first threshold value judgment circuit 222-1, if B in number of signals have the values "1" exist, judgment is made that error is caused in the delayed first to (K)th information series I1__D1 output from the syndrome series generation circuit 21 to output "1" as the E1__1. The threshold value B of the error detection circuit can be set arbitrary within a range not exceeding J.

When error is detected in the error detection circuit, error correction performance can be enhanced by eliminating the influence of the error from the syndrome series S1. In order to eliminate influence of error from the syndrome series S1, the error values E1__1 to EK__1 are fed back to the syndrome register 221. When the fedback error value is one, the register value of the corresponding shift register is inverted.

For example when the error value E1__1 is "1", the values of the $(d_{max}-d_{1\_1})$th to $(d_{max}-d_{1\_J})$th shift registers in the syndrome register 221 are inverted.

Figure 5:
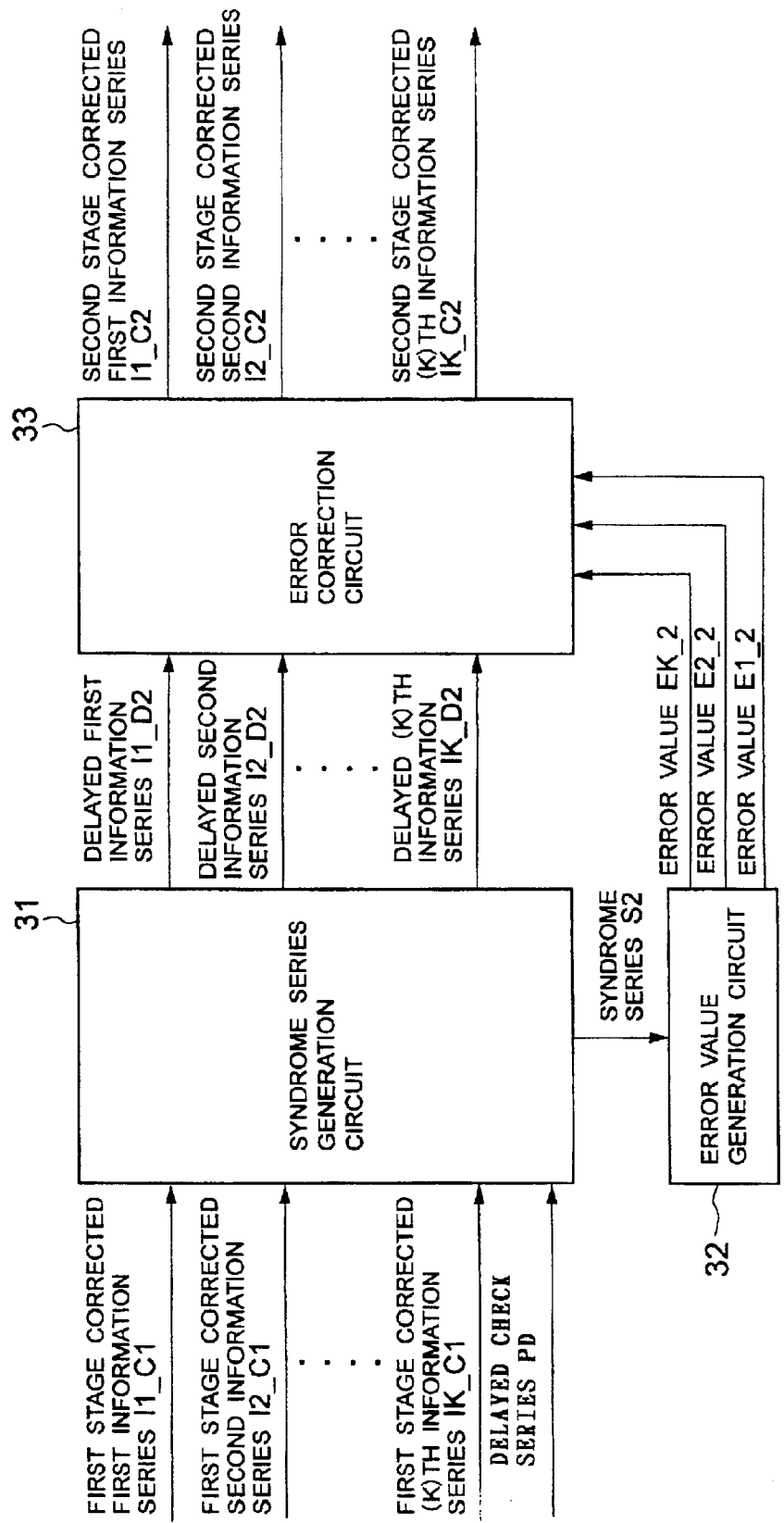
FIG. 5 is a block diagram showing a construction of a second stage decoding circuit of FIG. 1.

FIG. 5 is a block diagram showing a construction of the second decoding circuit 3 of FIG. 1. In FIG. 5, the second decoding circuit 3 is constructed with a syndrome series generation circuit 31, an error value generation circuit 32 and an error correction circuit 33.

It should be noted that the second decoding circuit 3 can be realized by the same construction as the first stage decoding circuit 2 shown in FIG. 2 except that the error detection counter for code synchronization and the check series register for transferring the check series to the next stage decoding circuit are eliminated and the threshold value in the threshold value judgment circuit in the error value generation circuit 32 is different. Operation of the second decoding circuit 3 is the same as that of the first stage decoding circuit 2.

The syndrome series generation circuit 31 generates a syndrome series S2 on the basis of the first stage corrected first to (K)th information series $I1_{13}$ C1 to IK__C1 and the delayed check series PD. The error value generation circuit 32 leads an error value on the basis of the syndrome series S2 input from the syndrome series generation circuit 31.

The error correction circuit 33 corrects the delayed information series I1__D2 to IK__D1 input from the syndrome series generation circuit 31 on the basis of the error values E1__2 to EK__2 input from the error value generation circuit 32 to output as second stage first to (K)th corrected information series I1__C2 to IK__C2.

Figure 6:
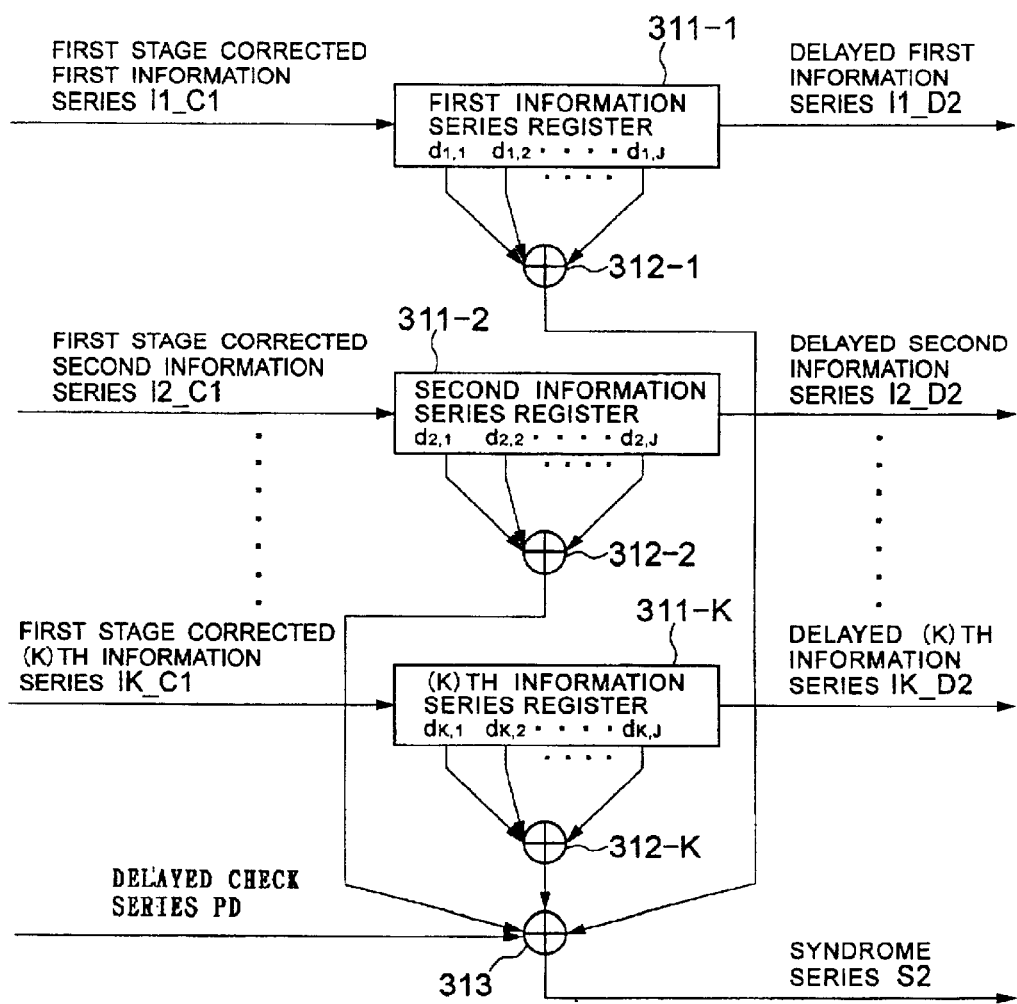
FIG. 6 is a block diagram showing a construction of a syndrome series generation circuit of FIG. 5.

FIG. 6 is a block diagram showing a construction of the syndrome series generation circuit 31 of FIG. 5. In FIG. 6, the syndrome series generation circuit 31 is constructed with first to (K)th information series. 311-1 to 311-K, first to (K)th information series exclusive OR circuits 312-1 to 312-K and a syndrome series generation exclusive OR circuit 313.

Each of the first to (K)th information series registers 311-1 to 311-K is constructed with, $d_{max}$ in number of shift registers. The first to (K)th corrected information series I1__C1 to IK__C1 are input to the first to (K)th information registers 311-1 to 311-K and then are shifted at every occurrence of clock. The first to (K)th corrected information series I1__C1 to IK__C1 delayed for $d_{max}$ clocks are output to the error correction circuit 33 as the first to (K)th delayed information series I1__D2 to IK__D2.

Similarly to the syndrome series generation circuit 21 in the first stage decoding circuit 2, $d_{max}$ in number of shift registers in the first to (K)th information series 311-1 to 311-K correspond to order number of the first to (K)th generation polynomial expression. The signals correspond to the order number the generation polynomial expression having non-zero coefficients are input to the first to (K)th information series exclusive OR circuits 312-1 to 312-K.

The first to (K)th information series exclusive OR circuits 312-1 to 312-K take exclusive OR of J in number of the input signals for outputting the result of exclusive OR operation to the syndrome series generation exclusive OR circuit 313. The syndrome series exclusive OR circuit 313 takes an exclusive OR of the outputs of the first to (K)th information series exclusive OR circuits 312-1 to 312-K and the delayed check series PD to output the result of exclusive OR operation to the error value generation circuit 32 as the syndrome series S2.

Figure 7:
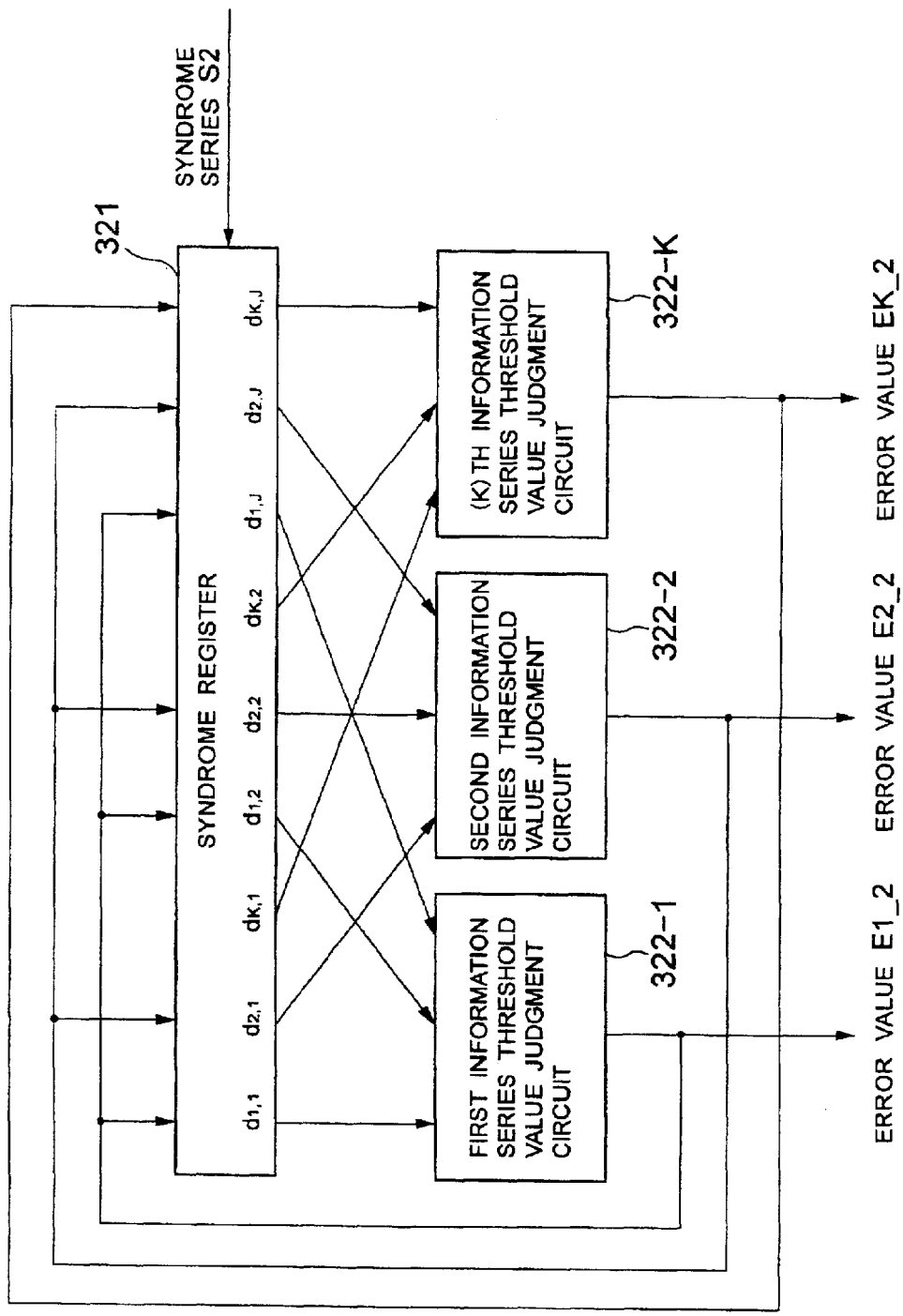
FIG. 7 is a block diagram showing a construction of an error value generation circuit of FIG. 5.

FIG. 7, is a block diagram showing a construction of the error value generation circuit 32. In FIG. 7, the error value generation circuit 32 is constructed with a syndrome register 321 and first to (K)th threshold value judgment circuits 322-1 to 322-K.

The syndrome register 321 is constructed with the $d_{max}$ in number of shift registers. The syndrome series S2 are input to the syndrome register 321 and shifted at every occurrence of clock. Similarly to the syndrome register 221 in the first stage decoding circuit 2, the dmax in number of shift registers in the syndrome register 321 corresponds to order number of the generation polynomial expression. The signals corresponding to order number of the generation polynomial expression having non-zero coefficients are output to corresponding threshold value judgment circuit.

The first to (K)th threshold value judgment circuits 322-1 to 322-K makes judgment that error is caused when the signals having value "1" J in number of among input signals is greater than or equal to the threshold value C and outputs "1" as the error values E1__2 to EK__2. Here, the threshold value C of the threshold value judgment is expressed by:

$$C = \lfloor J/2 \rfloor + \beta \qquad (5)$$

wherein $\beta$ is natural number.

When number of the signal having the value "1" is less than the threshold value V of the threshold value judgment circuit, judgment is made that error is not caused to output "0" as the error values E1__2 to EK__2. The threshold value of the threshold value judgment circuit maybe set arbitrarily within a range not exceeding J.

For example, comparing the second stage decoding circuit 3 assuming that the threshold value of the threshold value judgment circuit is A set forth above, and the conventional decoding circuit assuming that the threshold value of the threshold value judgment circuit is A, since the signal partly error corrected by the first stage decoding circuit 2 is input to the second stage decoding circuit 3, error correction which could not be corrected in the conventional circuit, can be achieved. This number of residual error can be made smaller in comparison with the conventional circuit.

Figure 8:
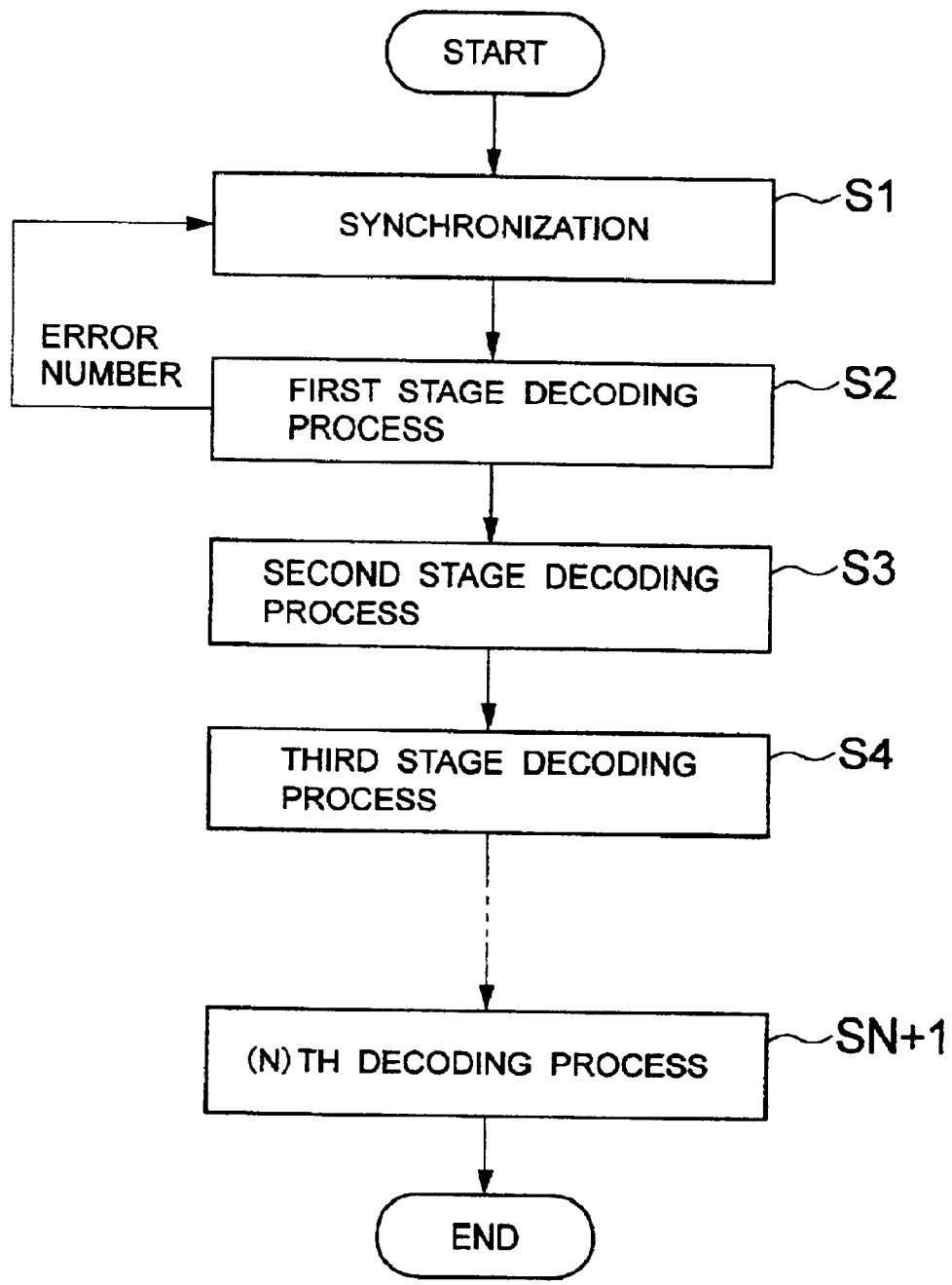
FIG. 8 is a flowchart showing operation of the preferred embodiment of the self orthogonal code decoding circuit according to the present invention.
Figure 9:
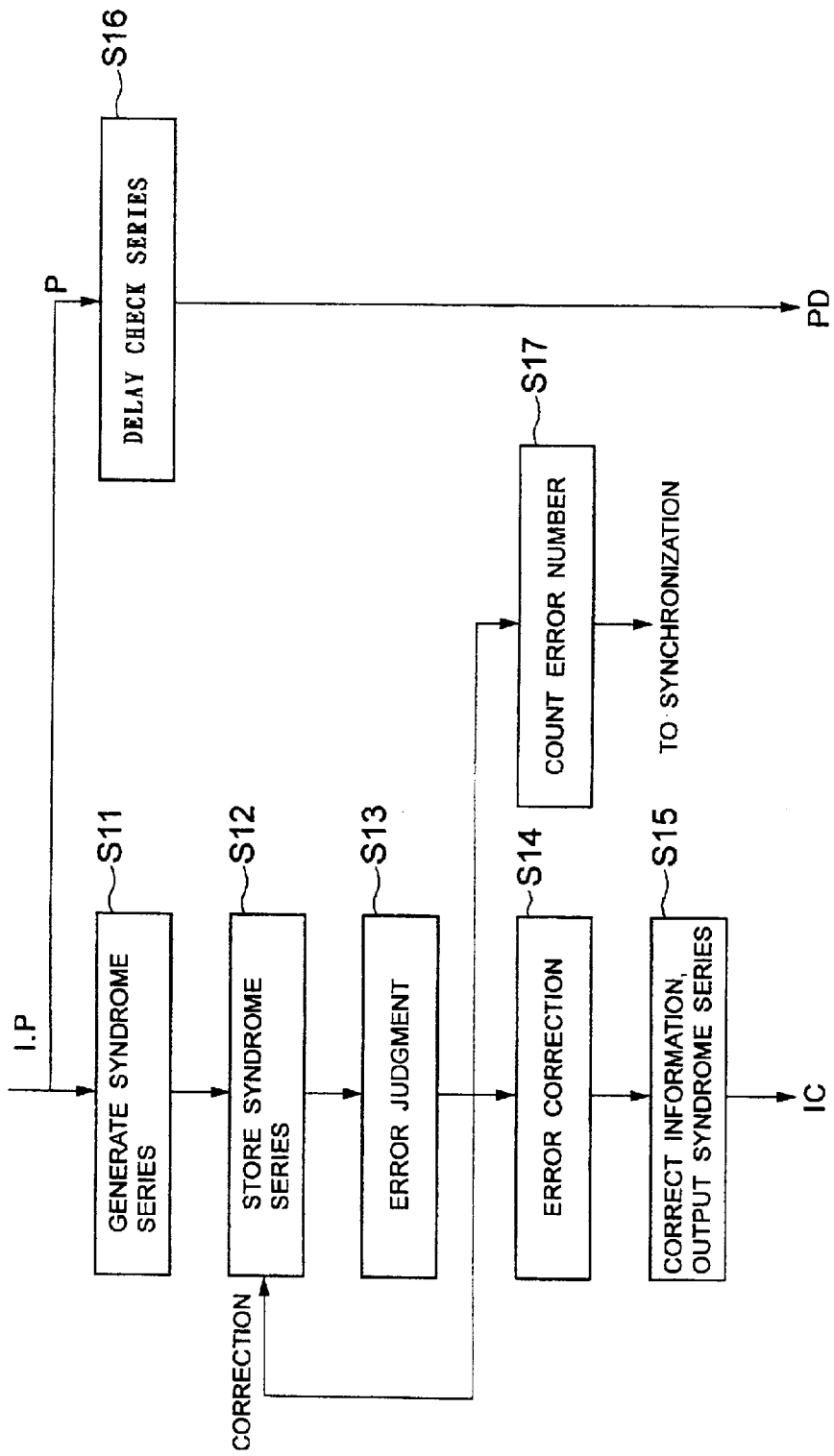
FIG. 9 is a flowchart showing a decoding process by the first stage decoding circuit of FIG. 1.

FIG. 8 is a flowchart showing operation of the preferred embodiment of the self orthogonal code decoding circuit according to the present invention, and FIG. 9 is a flowchart showing a decoding process by the first stage decoding circuit of FIG. 1. Operation of the shown embodiment of the self orthogonal code decoding circuit according to the present invention will be discussed with reference to FIGS. 1, 2, 5, 8 and 9.

When the reception series U is input to the self orthogonal code decoding circuit, the code synchronization and serial/parallel conversion circuit 1 establishes core synchronization and performs serial/parallel conversion of the reception series Y to split into the information series I1 to IK and the check series P to output the first stage decoding circuit 2 (step S1 of FIG. 8).

Here, the code synchronization performs based on the error count value EC input from the first stage decoding circuit 2. For example, when the error count value EC is greater than or equal to the threshold value, judgment is made that code synchronization is broken to vary the phase of the parallel signal to output to the first stage decoding circuit 2.

The first stage decoding circuit 2 takes the information series I1 to IK and the check series P as input and performs error correction on the basis of the information series I1 to IK and the check series P to output the first stage corrected first to (K)th information series I1_C1 to IK_C1 and the delayed check series PD to the second stage decoding circuit 3 (step S2 of FIG. 8).

Namely, the syndrome series generation circuit 21 of the first stage decoding circuit 2 generates the syndrome series S1 on the basis of the first to (K)th information series I1 to IK input from the code synchronization and serial/parallel conversion circuit 1 and the check series P (step S11 of FIG. 9) and stores the generated syndrome series S1 (step S12 of FIG. 9). The error value generation circuit 22 performs error judgment on the basis of the syndrome series S1 input from the syndrome series generation circuit 21 (step S13 of FIG. 9) for leading the error value.

The error detection counter 24 takes the error value E1_1 to EK_1 as inputs to count the error count detected over a given period to output the result of count as error count value EC to the code synchronization and serial/parallel conversion circuit 1 (step S17 of FIG. 9).

The error correction circuit 23 corrects the delayed information series I1_D1 to IK_D1 input from the syndrome series generation circuit 21 on the basis of the error value E1_1 to EK_1 input from the error value generation circuit 22 (step S14 of FIG. 9) to output the first stage corrected first to (K)th information series I1_C1 to IK_C1 to the second stage decoding circuit 3 (step S15 of FIG. 9).

Assuming that the maximum value of the maximum order number $d_{1\_J}$ to $d_{K\_J}$ of the first to (K)th generation polynomial expression G1 to GK is $d_{max}$ the check series register 25 shifts the check series P at every occurrence of clock to output the check series P delayed for d in number of clocks to the second stage decoding circuit 3 as the delayed check series PD (step S16 of FIG. 9).

Subsequently, the second stage decoding circuit 3 performs similar process as the decoding process by the first stage decoding circuit 2 (step S3 of FIG. 8) and performs error correction for the first stage corrected first to (K)th information series I1_C1 to IK_C1 reduced number of error by the first stage decoding circuit 2 to further reduce number of error.

Namely, the syndrome series generation circuit 31 of the second stage decoding circuit 3 generates a syndrome series S2 on the basis of the first stage corrected first to (K)th information series I1_C1 to IK_C1 input from the first stage decoding circuit 2 and the delayed check series PD. The error value generation circuit 32 lead an error value on the basis of the syndrome series S2 input from the syndrome series generation circuit 31.

The error correction circuit 33 performs correction of the delayed information series I1_D2 to IK_D2 input from the syndrome series generation circuit 31 on the basis of the error value E1_2 to EK_2 input from the error value generation circuit 32 to output as second stage corrected first to (K)th information series I1_C2 to IK_C2.

As set forth above, the shown embodiment of the self orthogonal code decoding circuit repeats decoding process by first stage to (N)th stage decoding circuits (in FIG. 3, the third stage to (N)th stage decoding circuits are eliminated from illustration) (steps S4 to SB+1 of FIG. 8) for improving error correction performance for gradually reducing number of error.

Particularly, by setting the threshold value of the threshold value judgment circuit in the first decoding large to make correction only for highly probable errors, and in the subsequent stages, the threshold values of the threshold value judgment circuits are gradually reduced in accordance with progress of decoding to correct errors of lower probability. This manner of error correction reduces possibility of causing erroneous correction to significantly improve error correction performance. The decoding process in the second decoding circuit to the (N)th decoding circuit is similar to the decoding process in the first stage decoding circuit 2.

When error is detected in the threshold value judgment circuit, by removing influence of error from the syndrome series, error correction performance can be improved. In order to eliminate influence of error from the syndrome series, the error value E1_2 to EK_2 are fed back to the syndrome register 321. When the fed back error value is "1", the value of the corresponding shift register is inverted.

In the shown embodiment of the decoding circuit according to the present invention as set forth above, discussion has been given for the case where decoding is repeated twice. However, as shown in FIG. 8, number times of decoding can be set arbitrarily and thus should not be specified to two as in the shown embodiment.

Figure 10:
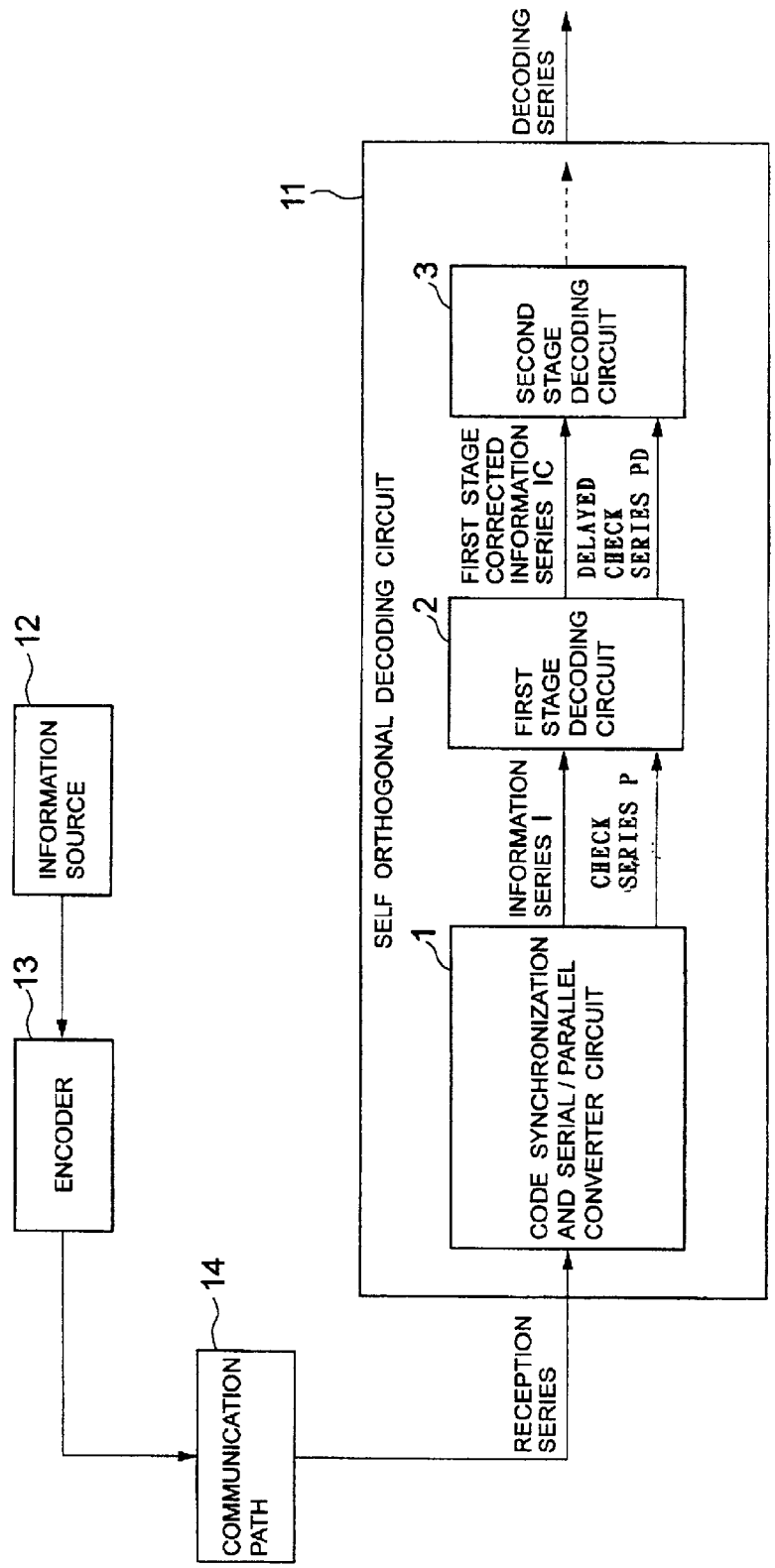
FIG. 10 is a block diagram showing an example of construction of a system employing the preferred embodiment of the self-orthogonal code decoding circuit according to the present invention.

FIG. 10 is a block diagram showing an example of construction of a system employing the preferred embodiment of the self-orthogonal code decoding circuit according to the present invention. In FIG. 10, the shown system is constructed with a self orthogonal code decoding circuit 11 of the construction and operation as set forth above, an information source 12 generating the information series, an encoder 13 converting the information series generated in the information source 12 into a code series, and a communication path 14 transmitting the code series converted by the encoder 13 to the self orthogonal code decoding circuit 11.

Namely, as set forth above, the self orthogonal code decoding circuit 11 is constructed with the code synchronization and serial/parallel conversion circuit 1, the first stage decoding circuit 2 and the second stage decoding circuit 3 and is responsive to reception of the code series converted by the encoder 13 as the reception series to perform decoding process (code synchronization, error correction and so forth) by the foregoing process operation.

It should be noted that the information source 12 may be storage medium, such as CD (Compact Disk), DVD (Digital Versatile Disk), hard disk or the like, information processing equipment generating information, generation circuit generating an audio signal or the like. On the other hand, as communication line, radio communication, wired communication by a wired cable, an optical cable or the like. However, the information source 12 and the communication path 14 are not specified to those listed above.

Figure 11:
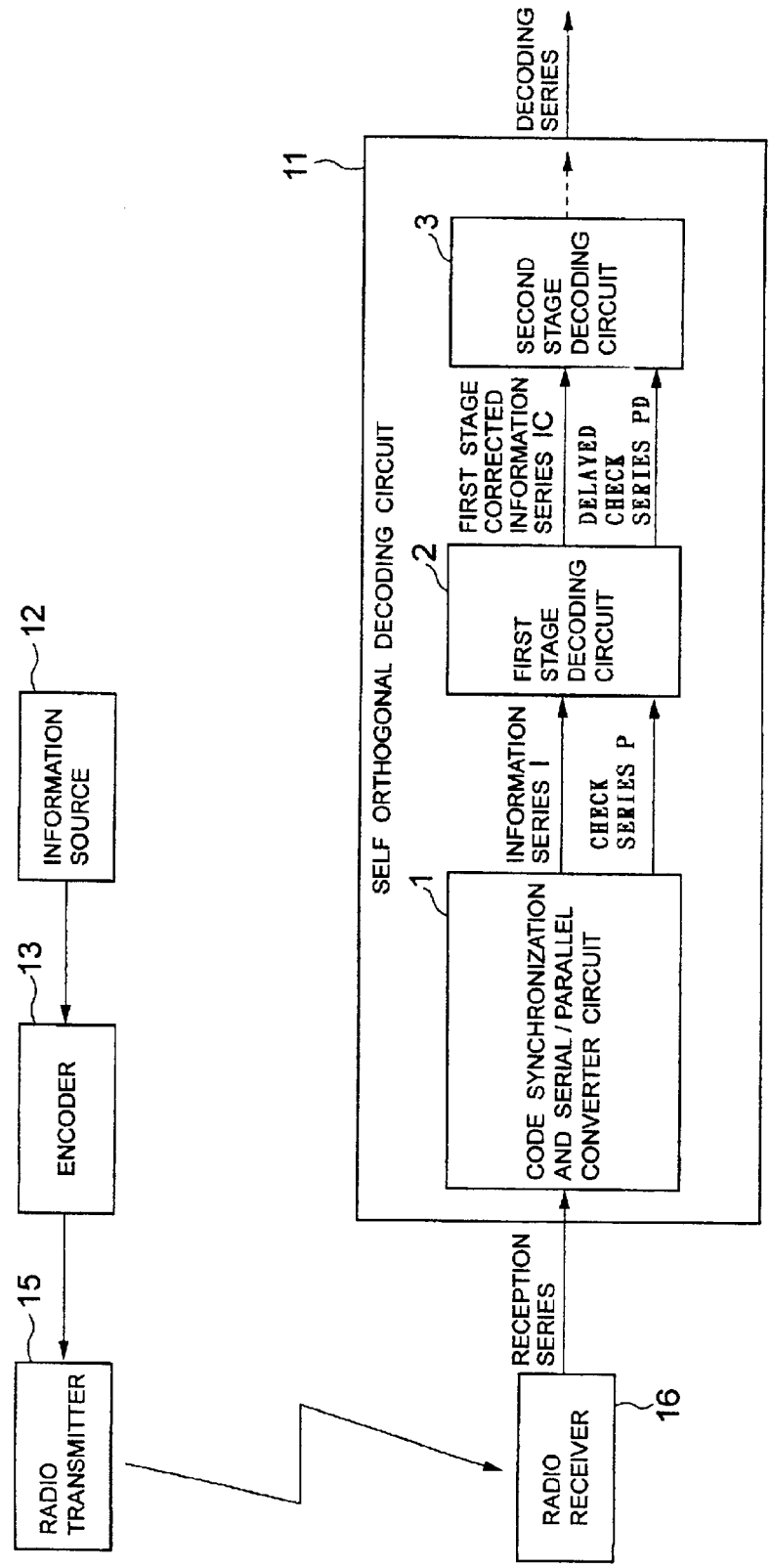
FIG. 11 is a block diagram showing an example of a construction of a radio system employing the preferred embodiment of the self-orthogonal code decoding circuit according to the present invention.

FIG. 11 is a block diagram showing an example of a construction of a radio system employing the preferred embodiment of the self-orthogonal code decoding circuit according to the present invention. In FIG. 11, the shown radio system is constructed with the self orthogonal code decoding circuit 11 taking the construction and operation set forth above, the information source 12 generating the information series, the encoder 13 converting the information series generating by the information source 12 into the code series, and a radio transmitter 15 and a radio receiver 16 for radio transmission of the code series converted by the encoder 13 to the self orthogonal decoding circuit 11.

Namely, as set forth above, the self orthogonal code decoding circuit 11 is constructed with the code synchronization and serial/parallel conversion circuit 1, the first stage decoding circuit 2 and the second stage decoding circuit 3. The self orthogonal code decoding circuit 11 is responsive to the code series generated by the encoder 13 transmitted and received through the radio transmitter 15 and the radio receiver 16 as the reception series to perform the foregoing process operation for decoding process (code synchronization, error correction and so forth). The self orthogonal code decoding circuit 11 is similar to a general purpose system except for the decoding process set forth above.

Figure 12:
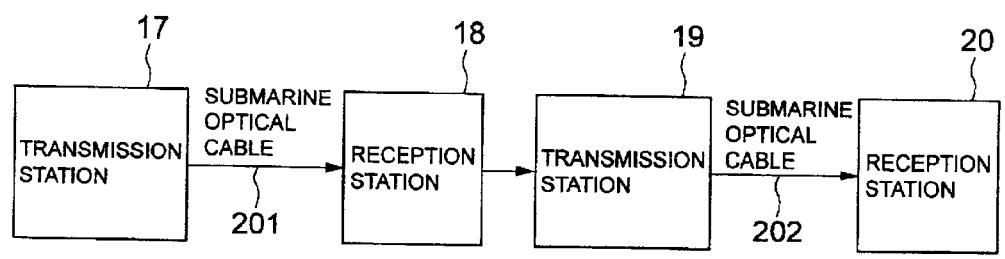
FIG. 12 is a block diagram showing an example of a construction of a transmission system of an optical cable employing the preferred embodiment of the self-orthogonal code decoding circuit according to the present invention.

FIG. 12 is a block diagram showing an example of a construction of a transmission system of an optical cable employing the preferred embodiment of the self-orthogonal code decoding circuit according to the present invention. In FIG. 12, an optical cable transmission system is constructed with transmission stations 17 and 19 and receiving stations 18 and 20. It should be noted that the transmission stations 17 and 19 and the receiving stations 18 and 20 are located on the ground. Between the transmission station 17 and the receiving station 18 and between the transmission station 19 and the receiving station 20 are connected by submarine optical cables 201 and 202.

An optical signal transmitted from the transmission station 17 is transmitted to the receiving station 18 through the submarine optical cable 201. In the receiving station 18, the optical signal is converted into a digital signal (electric signal). Then, the digital signal thus converted is subject to decoding process, such as code synchronization, error correction and so forth and then transferred to the transmission station 19. The transmission station 19 converted the signal provided the decoding process by the receiving station 18 into the optical signal to transmit to the receiving station 20 via the submarine optical cable 201. The receiving station 20 converts the optical signal from the transmission station 19 into the digital signal (electrical signal) to perform decoding process, such as code synchronization, error correction or the like.

Figure 13:
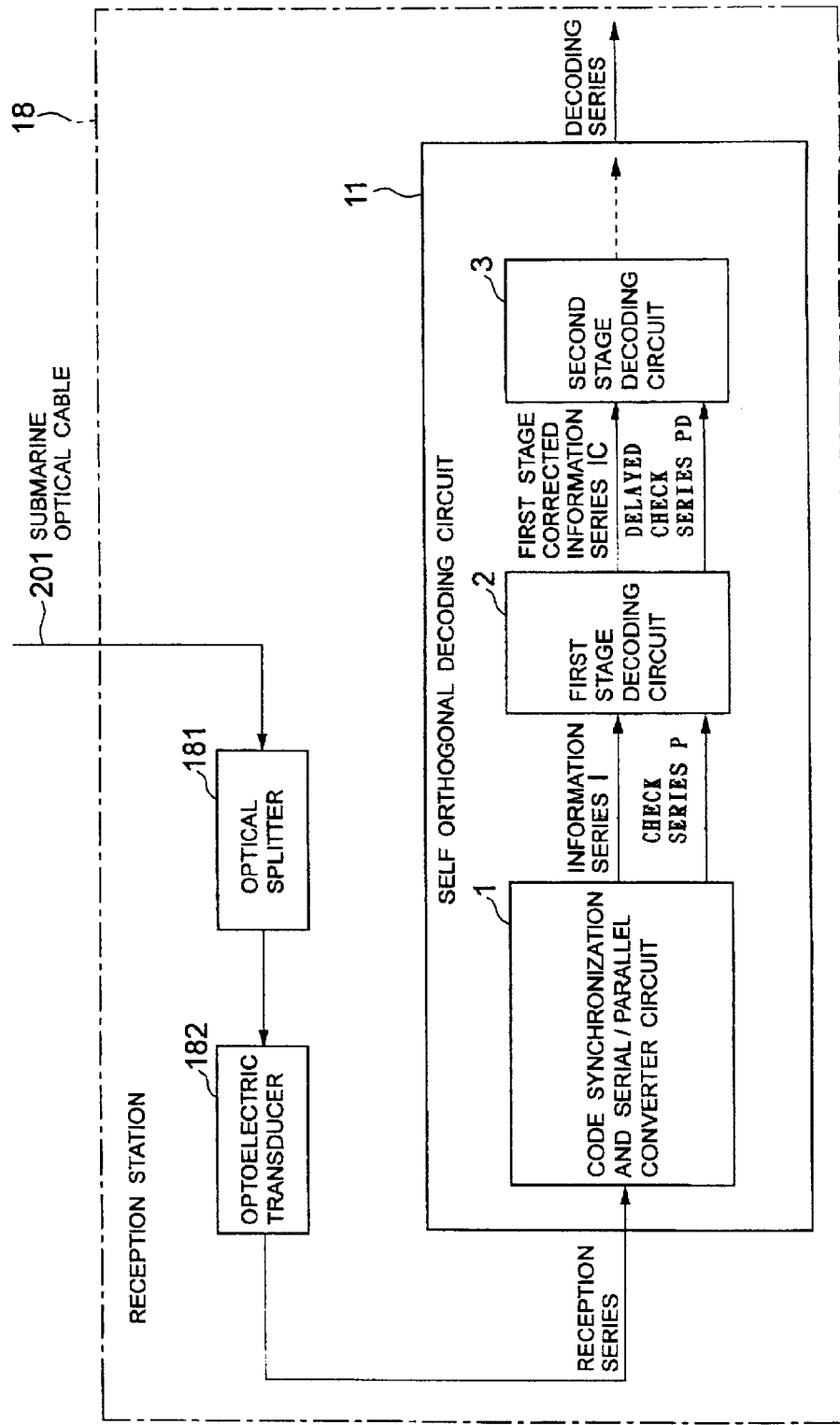
FIG. 13 is a block diagram showing a construction of a receiving station of FIG. 12.

FIG. 13 is a block diagram showing a construction of a receiving station of FIG. 12. In FIG. 13, the receiving station 18 is constructed with the self orthogonal decoding circuit 11 taking construction and operation set forth above, an optical splitter 181 and an photoelectric transducer 182. The optical splitter 181 separates the optical signal input through the submarine optical cable 201. The photoelectric transducer 182 converts the separated optical signal into the electric signal (digital signal).

As set forth above, the self orthogonal code decoding circuit 11 is constructed with the code synchronization and serial/parallel conversion circuit 1, the first stage decoding circuit 2 and second stage decoding circuit 3. The self orthogonal code decoding circuit 11 is responsive to the electric signal converted by the photoelectric transducer 182 as the reception series to perform the process set froth above for decoding process (code synchronization, error correction or the like). It should be noted that the receiving station 20 has the same construction and operation as those in the receiving station 18.

Figure 14:
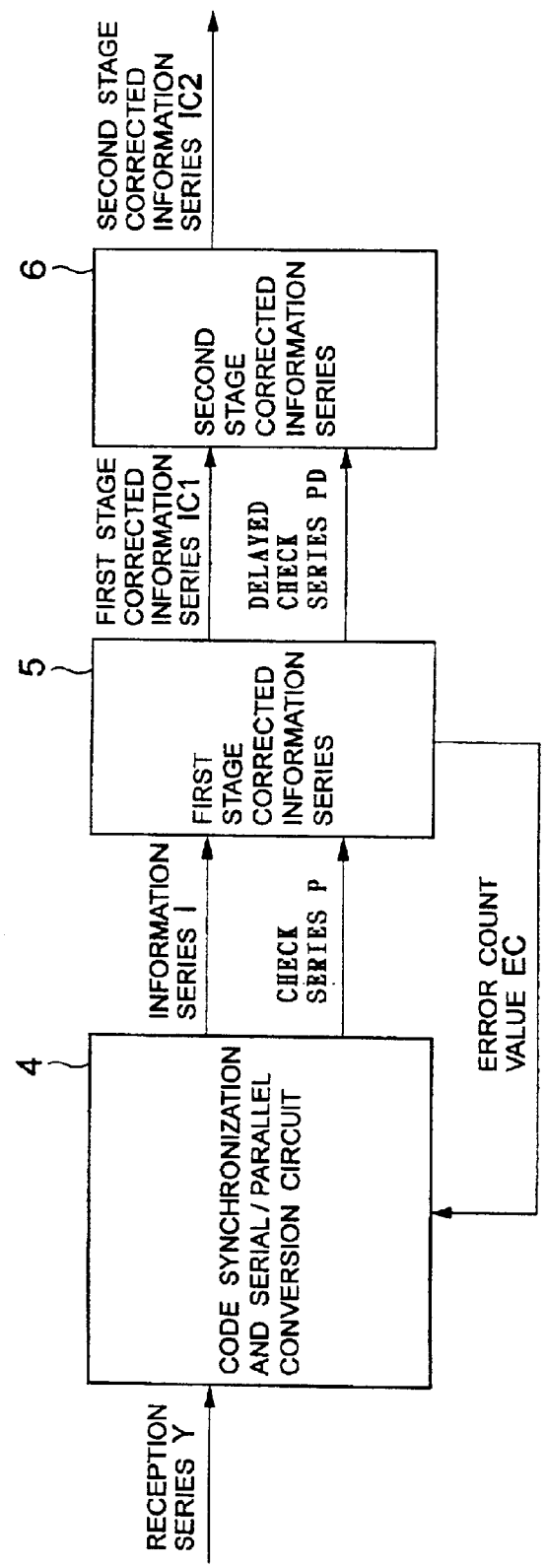
FIG. 14 is a block diagram showing a construction of another embodiment of the self orthogonal code decoding circuit according to the present invention.

FIG. 14 is a block diagram showing a construction of another embodiment of the self orthogonal code decoding circuit according to the present invention. In FIG. 14, another embodiment of the self orthogonal code decoding circuit according to the present invention is constructed with a code synchronization and serial/parallel conversion circuit 4, a first stage decoding circuit 5 and a second stage decoding circuit 6. It should be noted that, FIG. 14, there is shown a circuit construction in the case where the coding ratio is 1/2, the code generation polynomial expression is the foregoing expression (1), and number of times of repetition of decoding is two.

The code synchronization and serial/parallel conversion circuit 4 takes the reception series Y and the error count value EC output from the first stage decoding circuit 5 as input to perform code synchronization on the base of the error count value EC. The circuit 4 performs serial/parallel conversion for the reception series Y to output the information series I and the check series P to the first stage decoding circuit 5.

The first stage decoding circuit 5 receives the input of the information series I and the check series P to perform error correction on the basis of the information series I and the check series P to output a first stage corrected information series IC1 and the delayed check series PD to the second stage decoding circuit 6.

The second stage decoding circuit 6 takes the first stage corrected information series IC1 and the delayed check series PD to perform error correction on the basis of the first stage corrected information series IC1 and the delayed check series PD to output the second stage corrected information series IC2.

Figure 15:
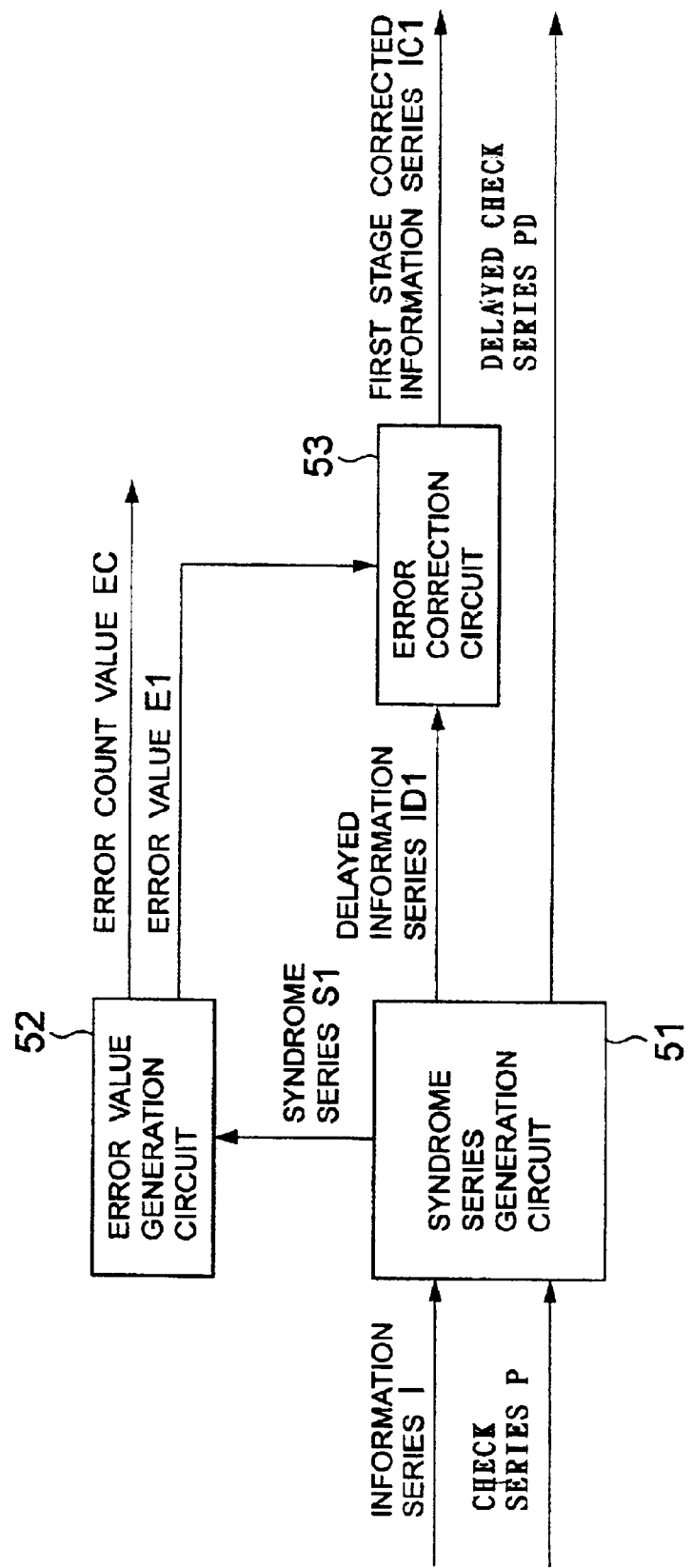
FIG. 15 is a block diagram showing a construction of the first stage decoding circuit of FIG. 14.

FIG. 15 is a block diagram showing a construction of the first stage decoding circuit 5 of FIG. 14. In FIG. 15, the first stage decoding circuit 5 is constructed with a syndrome series generation circuit 51, an error value generation circuit 52 and an error correction circuit 53.

The syndrome series generation circuit 51 generates the syndrome series S1 on the basis of the information series I input from the code synchronization and serial/parallel conversion circuit 4 and the check series P. The error value generation circuit 52 leads the error value on the basis of the syndrome series S1 input from the syndrome series generation circuit 51.

The error correction circuit 53 corrects the detailed information series ID1 input from the syndrome series generation circuit 51 on the basis of the error value E1 input from the error value generation circuit 52 to output to the second stage decoding circuit 6 as the first stage corrected information series IC1.

Figure 16:
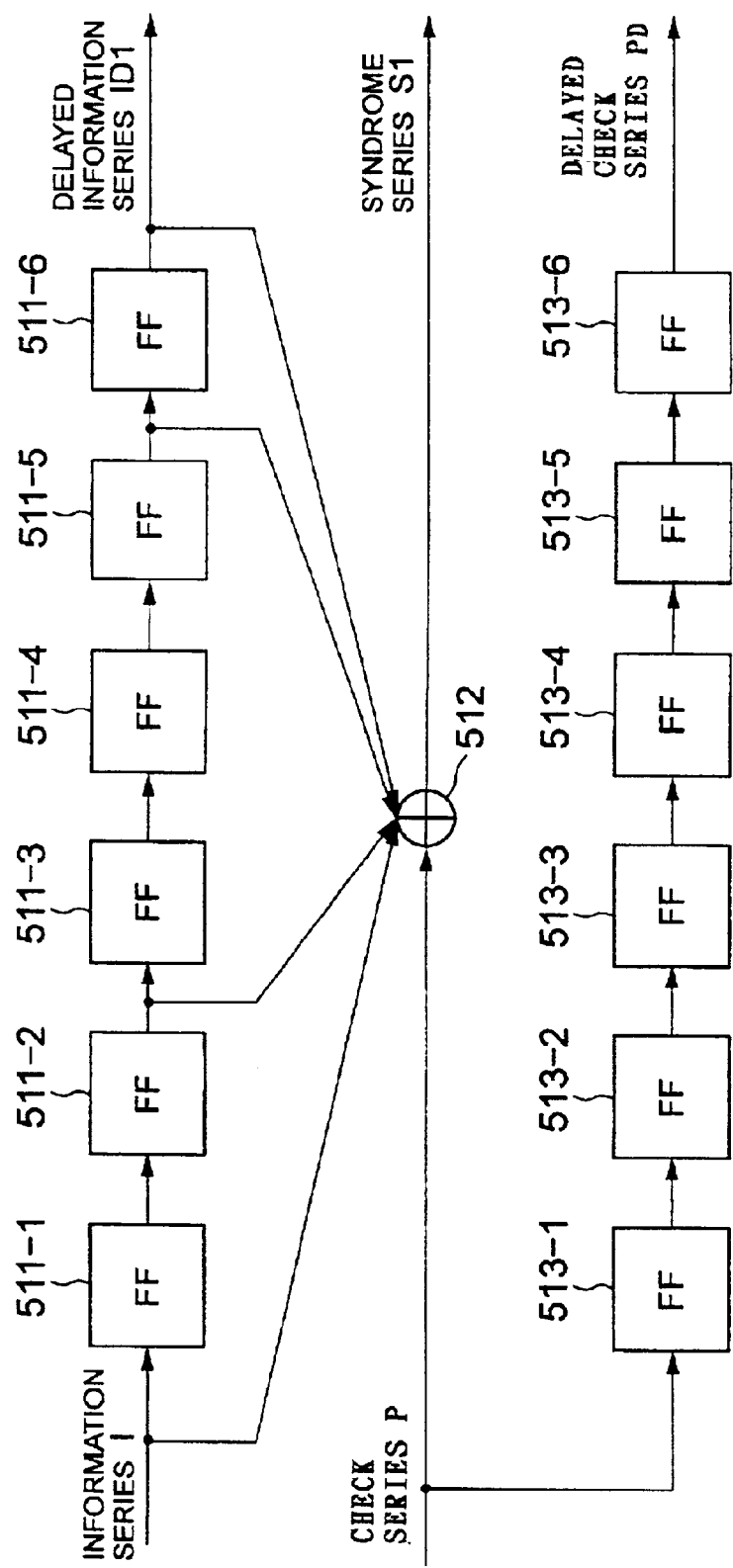
FIG. 16 is a block diagram showing a construction of the syndrome series generation circuit of FIG. 15.

FIG. 16 is a block diagram showing a construction of the syndrome series generation circuit 51 of FIG. 15. In FIG. 16, the syndrome series generation circuit 51 is constructed with first to sixth information series registers 511-1 to 511-6, an exclusive OR circuit 512 and first to sixth check series registers 513-1 to 513-6.

The first information series register 511-1 takes the information series I as input to output one clock delayed signal to the second information series register 511-2. The second information series register 511-2 takes the output of the first information register 511-1 as input to output one clock delayed signal to the third information series register 511-3. Similarly, the third to sixth information series registers 511-3 to 511-6 are connected in series. The sixth information series register 511-6 outputs the delayed information series ID1 delayed for six clocks relative to the information series I to the error correction circuit 53.

The exclusive OR circuit 512 takes the information series I, the outputs of the second, fifth and sixth information series registers and the check series P as inputs and outputs the result of exclusive OR operation to the error value generation circuit 52 as the syndrome series S1. The information series I, the second, fifth and sixth information series registers correspond to order number 0, 2, 5 and 6 of generation polynomial expression having non-zero coefficients.

The first check series register 513-1 takes the check series P as input to output the signal delayed for one clock to the second check series register 513-2. Similarly, the second to sixth check series registers 513-2 to 513-6 are also connected in series. The sixth check series register 513-6 outputs the delayed check series PD delayed for six clocks relative to the check series P to the second stage decoding circuit 6.

Figure 17:
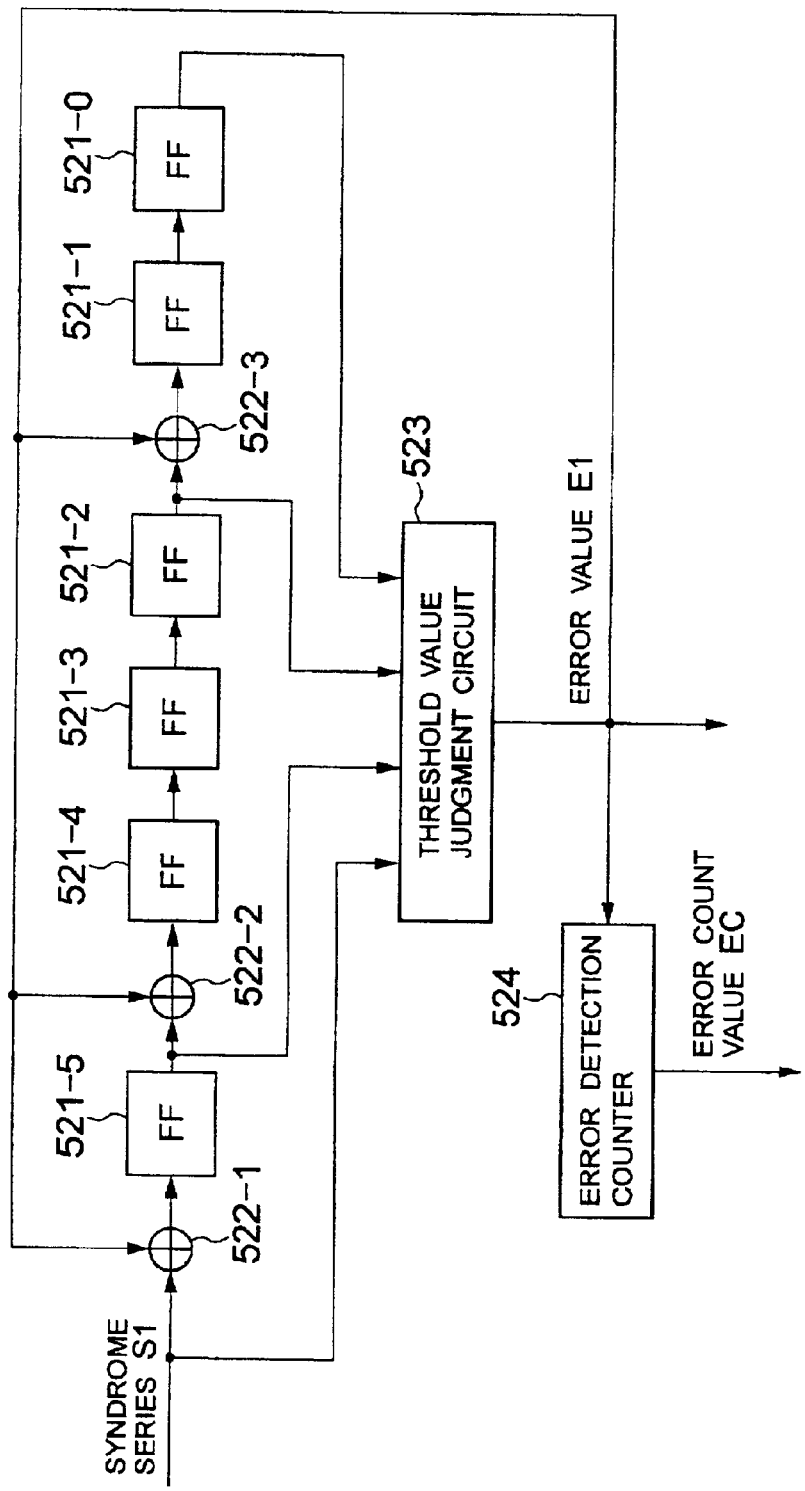
FIG. 17 is a block diagram showing a construction of the error value generation circuit of FIG. 15.

FIG. 17 is a block diagram showing a construction of the error value generation circuit 52 of FIG. 15. In FIG. 17, the error value generation circuit 52 is constructed with zeroth to fifth syndrome registers 521-0 to 521-5, a threshold value judgment circuit 523, a error detection counter 524 and syndrome correcting exclusive OR circuits 522-1 to 522-3.

The threshold value judgment circuit 523 takes the syndrome series S1 and outputs of the fifth, second and zeroth syndrome registers as inputs. When number of input signals having value "1" is greater than or equal to the threshold value, judgment is made that error is caused to output "1" as the error value E1 to the syndrome correcting exclusive OR circuits 522-1 to 522-3, the error detection counter 524 and error correction circuit 53, respectively.

When the number of input signals having value "1" is less than the threshold value, judgment is made that error is not caused, to output zero as the error value E1. The syndrome series S1 and the fifth, second and zeroth syndrome registers respectively correspond to order number 6, 5, 2, 0 of the generation polynomial expression having non-zero coefficients.

The zeroth to fifth syndrome registers 521-0 to 521-5 and the syndrome correcting exclusive OR circuits 522-1 to 522-3 have function for shifting from higher order register to lower order register at every occurrence of clock. Furthermore, in order to eliminate influence of error from the syndrome series, the signal output to the threshold value judgment circuit 523 has a function for inverting the value. In order to realize this function, the zeroth to fifth syndrome registers 521-0 to 521-5 and the syndrome correcting exclusive OR circuits 522-1 to 522-3 are connected in the following manner.

The syndrome correcting exclusive OR circuit 522-1 takes the syndrome series S1 and the error value E1 as inputs and outputs the result of exclusive OR operation to the fifth syndrome register 521-5. The fifth syndrome register 521-5 takes the output of the syndrome correcting exclusive OR circuit 522-1 as input to output one clock delayed signal to the syndrome correcting exclusive OR circuit 522-2 and the threshold value judgment circuit 523.

The syndrome correcting exclusive OR circuit 522-2 takes the output of the fifth syndrome register 521-5 and the error value E1 to output the result of exclusive OR operation to the fourth syndrome register 521-4. The fourth syndrome register 521-4 takes the output of the syndrome correcting exclusive OR circuit 522-2 as input to output one clock delayed signal to the third syndrome register 521-3.

The third syndrome register 521-3 takes the output of the fourth syndrome register 521-4 as input, and outputs one clock delayed signal to the second syndrome register 521-2. The second syndrome register 521-2 takes the output of the third syndrome register 521-3 as input to output the one clock delayed signal to the syndrome correcting exclusive OR circuit 522-3 and the threshold value judgment circuit 523.

The syndrome correcting exclusive OR circuit 522-3 takes the output of the second syndrome register 521-2 and the error value E1 as input to output the result of exclusive OR operation to the first syndrome register 521-1. The first syndrome register 521-1 takes the output of the syndrome correcting exclusive OR circuit 522-3 as input to output the one clock delayed signal to the zeroth syndrome register 521-0. The zeroth syndrome register 521-0 takes the output of the first syndrome register 521-1 as input to output the one clock delayed signal to the threshold value judgment circuit 523.

The error detection counter 524 takes the error value E1 as input to count the number of errors detected within a given period. The counted error count value EC is output to the code synchronization and serial/parallel conversion circuit 4. When transmission path condition is quite bad and number of inserted error is large, error correction is caused at every time of repetition of decoding number of errors to be detected upon in code synchronized condition and in a synchronous condition. Therefore, in the shown embodiment, error detection counter 524 is provided in the first stage decoding circuit 2. It should be noted that the error detection counter is not necessarily required to be provided in the first stage decoding circuit but can be provided in any stage of decoding circuit.

Figure 18:
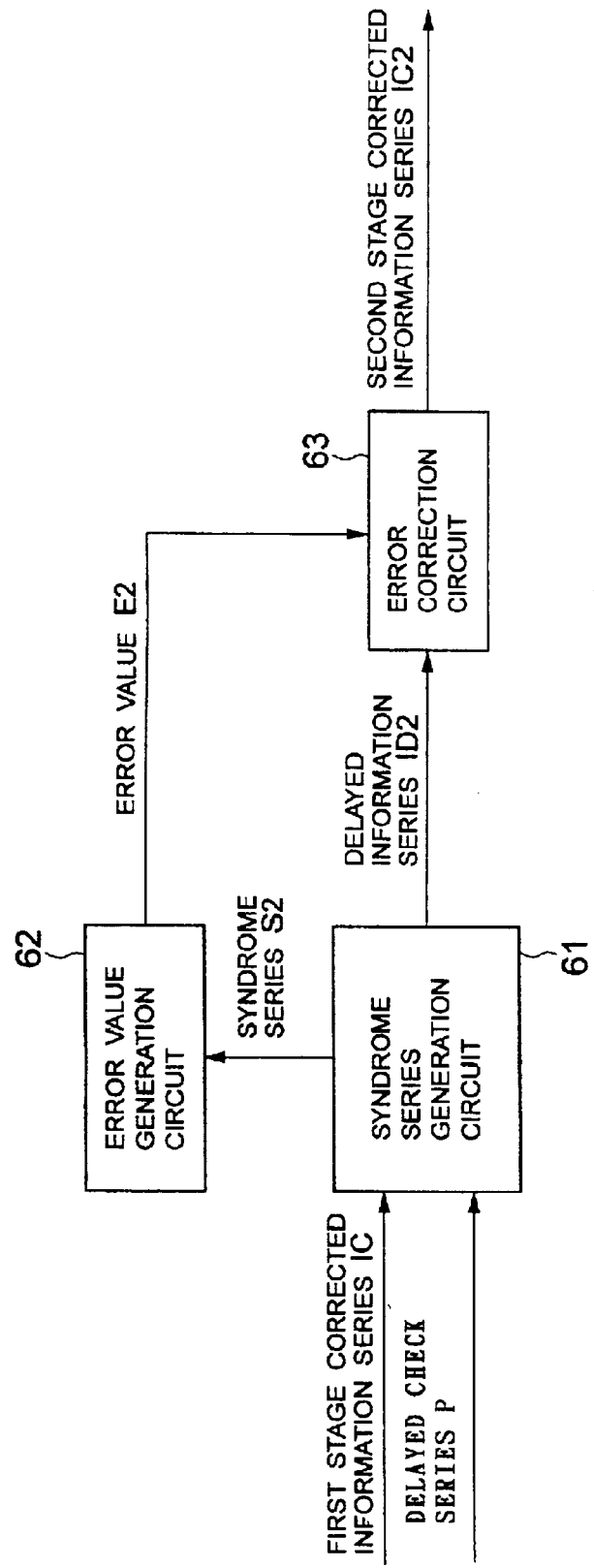
FIG. 18 is a block diagram showing a construction of the second decoding circuit of FIG. 14.

FIG. 18 is a block diagram showing a construction of the second decoding circuit 6 of FIG. 14. In FIG. 18, the second stage decoding circuit 6 is constructed with a syndrome series generation circuit 61, a error value generation circuit 62 and a error correction circuit 63. The second stage decoding circuit 6 can be realized with the same construction as the first stage decoding circuit 5 shown in FIG. 15 except that the error detection counter for code synchronization and the check series register for transferring the check series to the decoding circuit in the next stage are eliminated.

The syndrome series generation circuit 61 generates the syndrome series S2 on the basis of the first stage corrected information series IC1 input from the first stage decoding circuit 5 and the delayed check series PD. The error value generation circuit 62 leads the error value on the basis of the syndrome series S2 input from the syndrome series generation circuit 61.

The error correction circuit 63 corrects delayed information series ID2 input from the syndrome series generation circuit 61 on the basis of the correction value E2 input from the error value generation circuit 62 to output it as the second stage corrected information series IC2.

Figure 19:
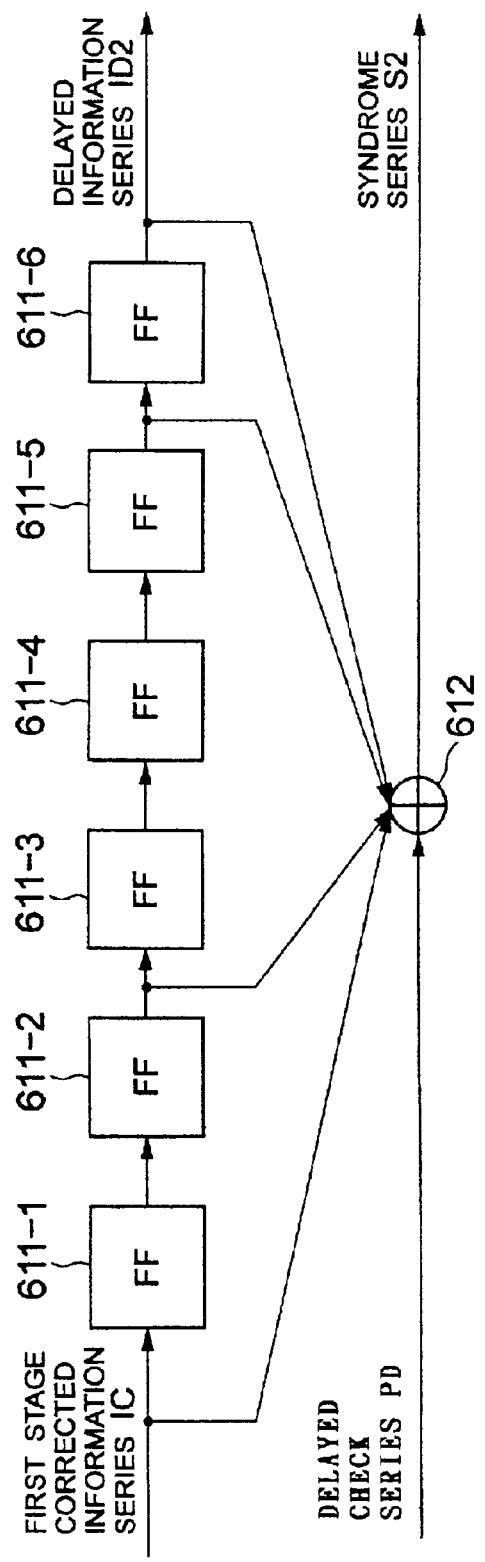
FIG. 19 is a block diagram showing a construction of the syndrome series generation circuit of FIG. 18.

FIG. 19 is a block diagram showing a construction of the syndrome series generation circuit 61 of FIG. 18. In FIG. 19, the syndrome series generation circuit 61 is constructed with first to sixth information series registers 611-1 to 611-6 and an exclusive OR circuit 612.

The first information series register 611-1 takes the first stage corrected information series IC1 as input and outputs a signal delayed for one clock to the second information series register 611-2. The second information series register 611-2 takes the output of the first information series register 611-1 as input and outputs a signal delayed for one clock to the third information series register 611-3. Similarly, the third to sixth information series registers 611-3 to 611-6 are also connected in series. The sixth information series register 611-6 outputs the delayed information series ID2 delayed for six clocks relative to the first stage corrected information series IC1 to the error correction circuit 63.

The exclusive OR circuit 612 takes the first stage corrected information series IC1, the outputs of the second, fifth and sixth information series registers and the delayed check series PD as inputs and outputs the result of exclusive OR operation to the error value generation circuit 62 as syndrome series S2. The first stage corrected information series IC1, the second, fifth and sixth information series register respectively correspond to order numbers of 0, 2, 5 and 6 of the generation polynomial having coefficients other than zero.

Figure 20:
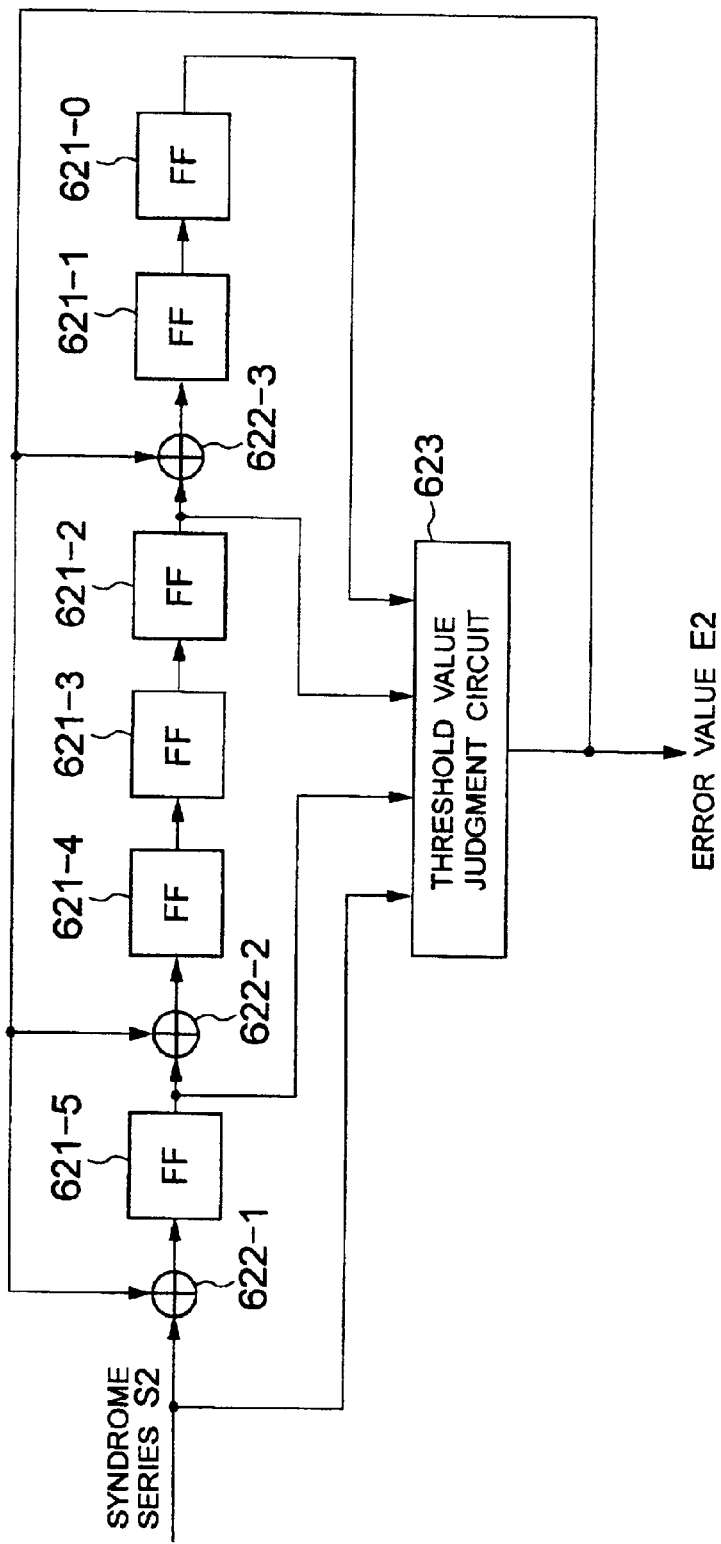
FIG. 20 is a block diagram showing a construction of the error value generation circuit of FIG. 18.

FIG. 20 is a block diagram showing a construction of the error value generation circuit 62 of FIG. 18. In FIG. 20, the error value generation circuit 62 is constructed with zeroth to fifth syndrome registers 621-0 to 621-5, a threshold value judgment circuit 623 and syndrome correcting exclusive OR circuits 622-1 to 622-3.

The threshold value judgment circuit 623 takes the syndrome series S2 and the outputs of the fifth, second and zeroth syndrome registers as input to make judgment that error is caused when number of input signals having value "1" is greater than the threshold value to output "1" to the syndrome correcting exclusive OR circuits 622-1 to 622-3 and the threshold value judgment circuit 623 as the correction value E2.

When number of the input signals having value "1" is less than the threshold value, judgment is made that error is not caused to output "0" as the error value E2. The syndrome series S2, the fifth, second and zeroth information series syndrome register respectively correspond to order numbers of 6, 5, 2, 0 of the generation polynomial having coefficients other than zero.

The zeroth to fifth syndrome registers 621-0 to 621-5 and the syndrome correcting exclusive OR circuits 622-1 to 622-3 have function for shifting the syndrome series S2 from higher order register to lower order register at every occurrence of clock. Furthermore, in order to eliminate influence of error from the syndrome series S2, the signal output to the threshold value judgment circuit 623 has a function for inverting the value when the error is detected. In order to realize the foregoing function, the zeroth to fifth syndrome registers 621-0 to 621-5 and the syndrome correcting exclusive OR circuits 622-1 to 622-3 are connected in the following manner.

The syndrome correcting exclusive OR circuit 622-1 takes the syndrome series S2 and the correction value E2 as inputs and outputs the result of exclusive OR operation to the fifth syndrome register 621-5. The fifth syndrome register 621-5 takes the output of the syndrome correcting exclusive OR circuit 622-1 as input to output one clock delayed signal to the syndrome correcting exclusive OR circuit 622-2 and the threshold value judgment circuit 623.

The syndrome correcting exclusive OR circuit 622-2 takes the output of the fifth syndrome register 621-5 and the correction value E2 as input and outputs the result of exclusive OR operation to the fourth syndrome register 621-4. The fourth syndrome register 621-4 takes the output of the syndrome correcting exclusive OR circuit 622-2 as input to output the one clock delayed signal to the third syndrome register 621-3.

The third syndrome register 621-3 takes the output of the fourth syndrome register 621-4 as input to output the one clock delayed signal to the second syndrome register 621-2. The second syndrome register 621-2 takes the output of the third syndrome register 621-3 as input to output one clock delayed signal to the syndrome correcting exclusive OR circuit 622-3 and the threshold value judgment circuit 623.

The syndrome correcting exclusive OR circuit 622-3 takes the output of the second syndrome register 621-2 and the correction value E2 as input to output the result of exclusive OR operation to the first syndrome register 621-1. The first syndrome register 621-1 takes the output of the syndrome correcting exclusive OR circuit 622-3 as input to output one clock delayed signal to the zeroth syndrome register 621-0. The zeroth syndrome register 621-0 takes the output of the first syndrome register 621-1 as input to output one clock delayed signal to the threshold value judgment circuit 623.

Next, in the shown embodiment of the self-orthogonal code decoding circuit according to the present invention, operation will be discussed with reference to FIGS. 14 to 20 and in terms that the coding ratio is 1/2, the code generating polynomial expression is foregoing (1), number of orthogonal is four and number or times of repetition of decoding is 2.

In case of the self orthogonal code of coding ratio 1/2, the check series of the same ratio is added to the information series in the not shown encoder to generate a transmission series, in which the information series and check series are arranged alternately. The transmission series is output to the line and the reception series Y, which is generated by adding error to the transmission system, is input to the decoding circuit.

The code synchronization and serial/parallel conversion circuit 4 performs code synchronization, serial/parallel conversion of the reception series Y to output the information series I and the check series P to the first stage decoding circuit 5. At this time, the code synchronization in the code synchronization and serial/parallel conversion circuit 4 is performed on the basis of error count value EC input from the first stage decoding circuit 5. For example, when the error count value EC is greater than or equal to the threshold value, judgment is made that code synchronization is broken to vary phase of the parallel signal to be output to the first stage decoding circuit 5.

The first stage decoding circuit 5 takes the information series I and the check series P as inputs to perform error correction on the basis of the information series I and the check series P for outputting the first stage corrected information series IC1 and the delayed check series PD to the second stage decoding circuit 6.

The information series I is input to the first information series register 511-1 and is shifted to higher order information series register at every occurrence of the clock. Accordingly, the delayed information series ID1 output from the sixth information series, register 511-6 is delayed for six clocks relative to the information series I. The delayed information series ID1 delayed by the information series register is output to the error correction circuit 53.

Order number of the information series register corresponds to order number of generation polynomial expression. The input information series I correspond to zeroth of generation polynomial expression. The syndrome series S1 derived by exclusive OR of the signal corresponding to order number of the generation polynomial expression having non-zero coefficient and the check series P.

The generation polynomial expression of the shown embodiment has non-zero coefficient at zeroth, second, fifth and sixth order. Therefore, the information series I, the outputs of the second, fifth and sixth information series registers and the check series P are input to the exclusive OR circuit 512. The exclusive OR circuit 512 takes an exclusive OR of the input signals to output the result to the error value generation circuit 52 as the syndrome series S1.

The check series P is input to the first check series register 513-1 and is shifted to higher order check series register at every occurrence of clock. Accordingly, the delayed check series PD output from the sixth check series register 513-6 is delayed for six clocks relative to the check series P. The delayed check series PD delayed in the same extent as the information series is output to the second stage decoding circuit 6.

The error value generation circuit 52 leads an error value on the basis of the syndrome series S1 input from the syndrome series generation circuit 51. The syndrome series S1 is input to the fifth syndrome register 521-5 and then shifted to lower order syndrome register at every occurrence of the clock. Number of orders of the syndrome registers corresponds to order number of the generation polynomial expression. The syndrome series S1 corresponds to sixth order.

The signal corresponding to order number of the generation polynomial expression having non-zero coefficient is output to the threshold value judgment circuit 523. In the shown embodiment, the syndrome series S1 and the outputs of the fifth, second and zeroth syndrome registers are output to the threshold value judgment circuit 523.

For example, consideration is given that the case where the threshold value of the threshold value judgment circuit 523 is four. In this case, when all of the input signals of the four threshold value judgment circuits are "1", judgment is made that error is contained in the delayed information series ID1 to output as the error value E1. When number of input signals having value "1" is less than four, judgment is made that error is not contained in the delayed information series ID1 to output "0" as the error value E1.

When error is detected in the threshold value judgment circuit 523, in order to eliminate influence of error from the syndrome series S1, the signal input to the threshold value judgment circuit 523 inverts the value when the error is detected and input to the lower order syndrome register. Particularly, inversion of the value is performed by the syndrome correcting exclusive OR circuits 522-1 to 522-3.

The syndrome correcting exclusive OR circuits 522-1 to 522-3 takes the syndrome series S1 and outputs of the fifth and second syndrome registers as first input and the error value E1 as second input. The syndrome correcting exclusive OR circuits 522-1 to 522-3 takes an exclusive OR of the first input and the second input to output the result of exclusive OR operation to respective of the fifth, fourth and first syndrome registers.

The error detection counter 524 receives the error value E1 as input to count number of errors detected with a given period. The error count value EC as counted is output to the code synchronization and serial/parallel conversion circuit 4.

The error correction circuit 53 corrects the delayed information series ID1 input from the syndrome series generation circuit 51 on the basis of the error value E1 input from the error value generation circuit 52 to output the first stage corrected information series IC1 to the second stage decoding circuit 6. The second stage decoding circuit 6 performs error correction for the first stage corrected information series IC1 reduced number of error in the first stage decoding circuit 5 to further reduce number of errors.

The first to sixth information series registers 611-1 to 611-6 has a function for delaying the information series until end of the error detection process and a function for generating syndrome series S2 together with the exclusive OR circuit 612.

The delayed information series ID1 is input to the first information series register 611-1 and is shifted to higher order information series register at every occurrence of clock to output the delayed information series ID2 delayed by the information series register to the error correction circuit 63.

The order number of the information series register corresponds to the order number of generation polynomial expression. The delayed information series ID1 corresponds to zeroth of the generation polynomial expression. The syndrome series S2 is derived by exclusive OR of the signal corresponding to order number of the generation polynomial expression having non-zero coefficients and the delayed check series PD.

The generation polynomial expression in the shown embodiment has non-zero coefficients at zeroth, second, fifth and sixth order. Therefore, the delayed information series ID1, the outputs of the second, fifth and sixth information series registers and the delayed check series PD are input to the exclusive OR circuit 612. The exclusive OR circuit 612 takes exclusive OR of the input signals to output the result of the exclusive OR operation to the error value generation circuit 62 as the syndrome series S2.

The error value generation circuit 62 leads the error value on the basis of the syndrome series S2 input from the syndrome series generation circuit 61. The syndrome series S2 is input to the fifth syndrome register 621-5 to be shifted to lower order syndrome register at every occurrence of clock. The order number of the syndrome register corresponds to order number of generation polynomial expression. The syndrome series S2 corresponds to sixth order.

The signal corresponding to order number of the generation polynomial expression having non-zero coefficient is output to the threshold value judgment circuit 623. In the shown embodiment, the syndrome series S2 and the outputs of the fifth, second and zeroth syndrome registers are output to the threshold value judgment circuit 623.

For example, consideration is given for the case where the threshold value judgment circuit 623 is three. In this case, when number of input signals having value "1" is greater than or equal to 3, judgment is made that error is caused to output "1" as correction value E2. If the number of input signal having value "1" is less than 3, judgment is made that error is not contained to output "0" as correction value E2.

The conventional decoding circuit performs decoding of the threshold value 3 only once in the threshold value judgment circuit. The shown embodiment of the decoding circuit performs decoding for a plurality of times to improve error correction performance. In the shown embodiment, the threshold value of the threshold value judgment circuit of the first stage decoding circuit 5 is set at 4 and the threshold value of the threshold value judgment circuit of the second stage decoding circuit 6 is set at 3. In this case, only those having high probability of containing error are corrected in the first stage decoding circuit 5.

The threshold value of the threshold value judgment circuit of the second stage decoding circuit 6 is the same as the conventional decoding circuit. However, since the signal, in which part of the error is corrected in the first stage decoding circuit 5 is input, possibility of occurrence of error correction can be reduced, and error which could not be corrected by the conventional decoding circuit can be corrected. Therefore, the output of the second stage decoding circuit 6 has smaller number of residual error in comparison with the output of the conventional decoding circuit.

When error is detected by the threshold value judgment circuit 623, error correction performance can be enhanced by eliminating influence of error from the syndrome series S2. In order to eliminate the influence of error from the syndrome series S2, the signal to be input to the threshold value judgment circuit 623 is inverted the value thereof when error is detected and then input to the lower order syndrome register. Particularly, inversion of the values is performed by the syndrome correcting exclusive OR circuits 622-1 to 622-3.

The syndrome correcting exclusive OR circuits 622-1 to 622-3 take the syndrome series S2, the outputs of the fifth and second syndrome registers as first input and the correction value E2 as second input. The syndrome correcting exclusive OR circuits 622-1 to 622-3 take exclusive OR of the first and second inputs to output the result of exclusive OR operation to the fifth, fourth and first syndrome registers.

The error correction circuit 63 corrects the delayed information series ID2 input from the syndrome series generation circuit 61 on the basis of the correction value E2 input from the error value generation circuit 62 to output as second stage corrected information series IC2.

Next, in the shown embodiment of the self-orthogonal code decoding circuit according to the present invention, operation has been discussed in terms that the coding ratio is 1/2, the code generating polynomial expression is foregoing (1), number of orthogonal is four and number or times of repetition of decoding is 2. However, coding ratio, number of orthogonal, generation polynomial expression and number of times of repetition of decoding can be set arbitrary.

The conventional decoding had encountered problem in low error correction performance while decoding is easily and can be easily applied for systems. The present invention can be realized with simple circuit construction and can achieve significantly high error correction performance.

By delaying the check series using the check series register and inputting the result of the delaying to the next decoding circuit, decoding can be repeated and the error correction performance can be significantly improved.

On the other hand, by setting the threshold value of the threshold value judgment circuit in the first decoding large to make correction only for highly probable errors, and in the subsequent stages, the threshold values of the threshold value judgment circuits are gradually reduced in accordance with progress of decoding to correct errors of lower probability. This manner of error correction reduces possibility of causing erroneous correction to significantly improve error correction performance.

Next, another embodiment of the present invention will be discussed with reference to the drawings. In one embodiment of the present invention, the error value output from the threshold value judgment circuit in the first stage decoding circuit is counted to perform judgment of code synchronization on the basis of the counted error detection number. However, the threshold values of the threshold value judgment circuit in the first stage decoding circuit are set large, number of error detection upon code synchronization and number of error detection in asynchronous state are not significantly different to cause difficulty in judgment of code synchronization/asynchronization.

In order to solve this problem, in another embodiment of the present invention, separately from the threshold value judgment circuit from error generation, the threshold value judgment circuit dedicated for code synchronization is provided for setting the threshold value low. Hereinafter, similarly to one embodiment of the present invention, operation and construction of another embodiment of the present invention will be discussed in terms that the coding ratio is 1/2, the code generating polynomial expression is foregoing (1), number of orthogonal is four and number or times of repetition of decoding is 2.

Another embodiment of the decoding circuit according to the present invention has similar construction as one embodiment of the present invention except for providing of the threshold value judgment circuit dedicated for code synchronization in the error generation circuit 52 in the first stage decoding circuit 5 and threshold value is set at lower value. In the following discussion, the same reference numerals as the former embodiment of the present invention will be used.

Figure 21:
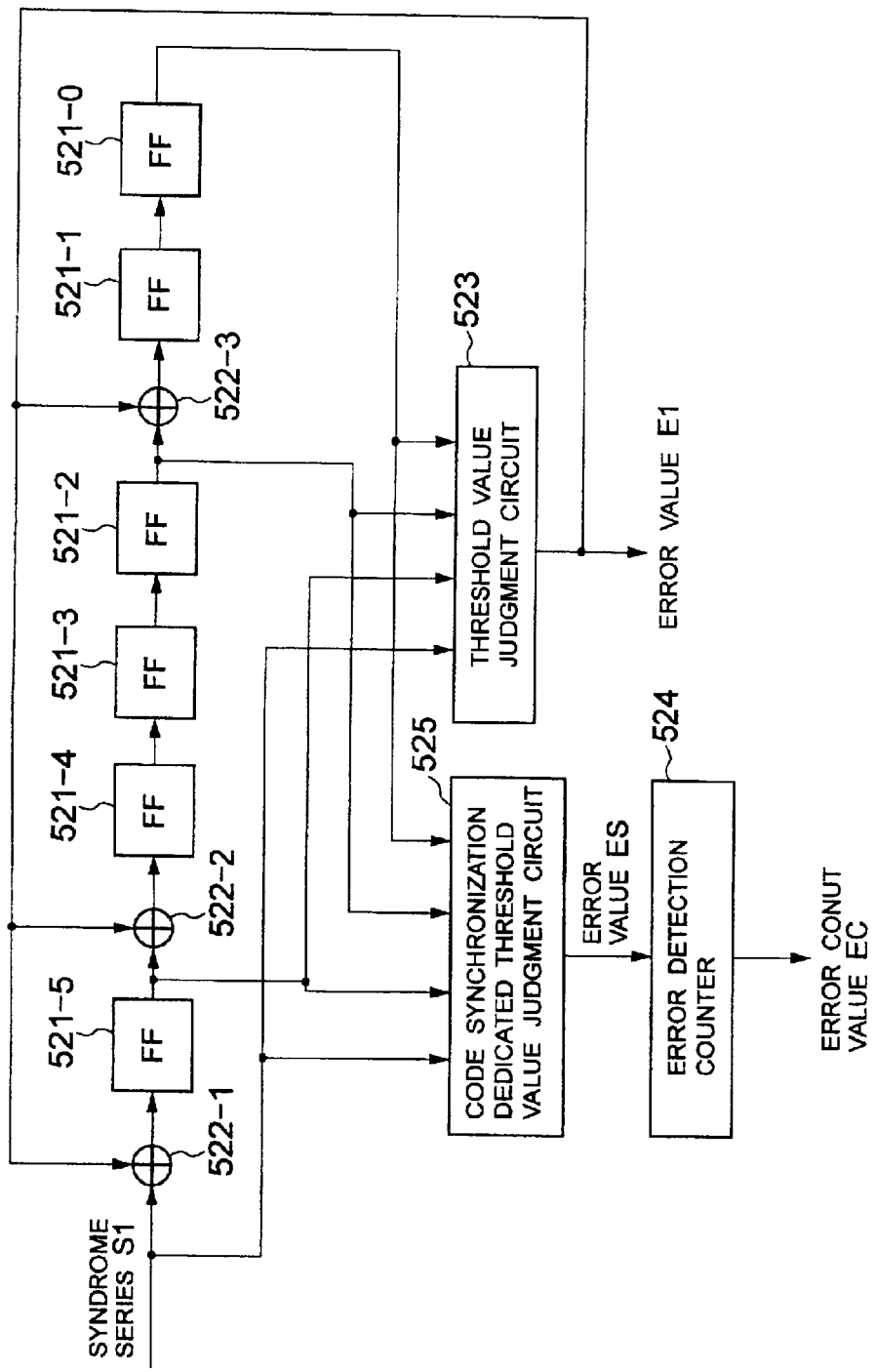
FIG. 21 is a block diagram showing a construction of an error value generation circuit in another embodiment of the first stage decoding circuit according to the present invention.

FIG. 21 is a block diagram showing a construction of an error value generation circuit in another embodiment of the first stage decoding circuit according to the present invention. In FIG. 21, the error value generation circuit 52 in another embodiment of the present invention, is constructed with the zeroth to fifth syndrome registers 521-0 to 521-5, the threshold value judgment circuit 523, the error detection counter 524, the syndrome correcting exclusive OR circuits 522-1 to 522-3 and code synchronization dedicated threshold value judgment circuit 525.

Figure 22:
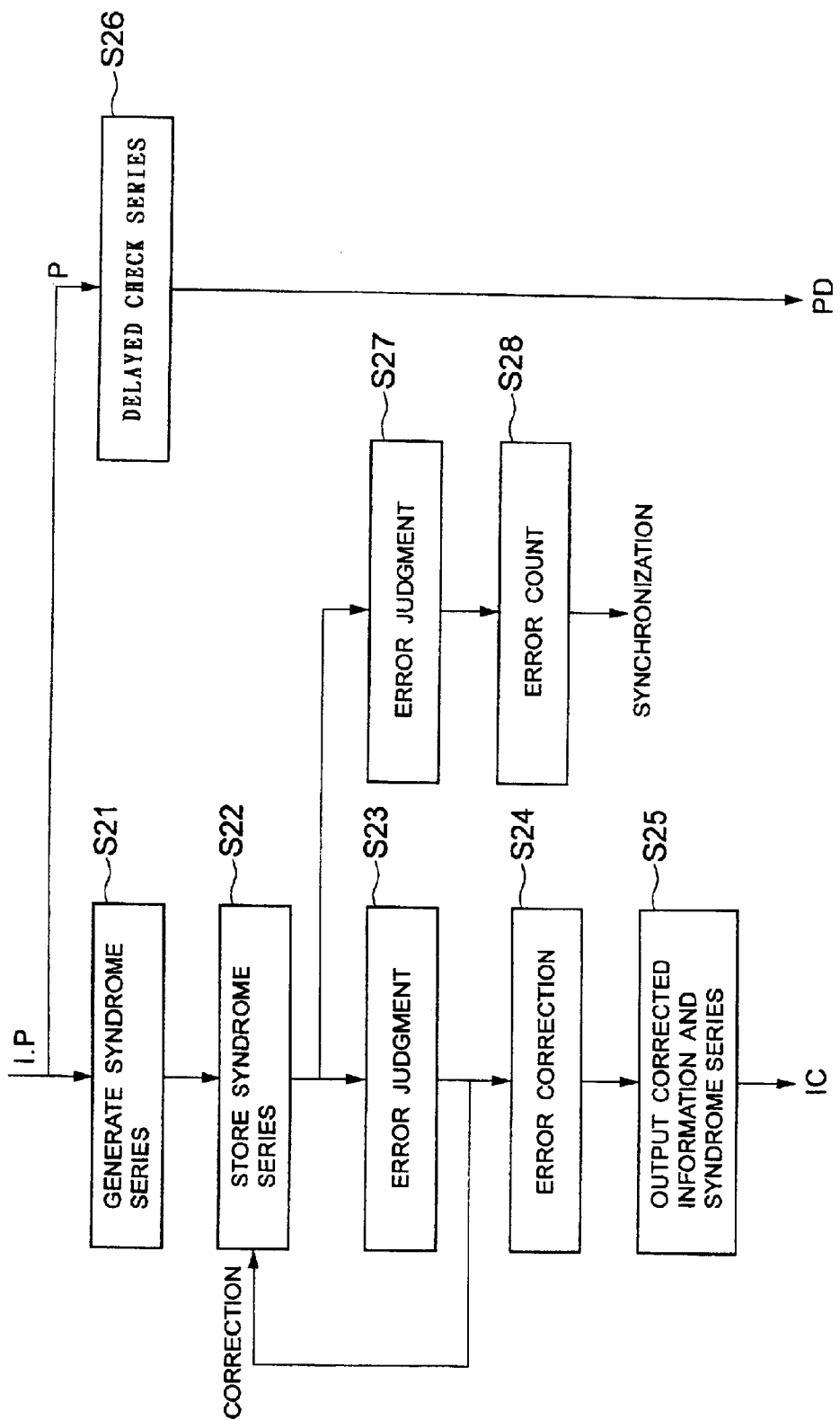
FIG. 22 is a flow chart showing decoding process in another embodiment of the first stage decoding circuit according to the present invention.

FIG. 22 is a flowchart showing decoding process in another embodiment of the first stage decoding circuit according to the present invention. Decoding process in the first stage decoding circuit in another embodiment of the present invention will be discussed with reference to FIGS. 21 and 22. Process operation at steps 21 to 26 are similar to the process operation at steps 11 to 16 shown in FIG. 9. Discussion for these process operation will be eliminated.

The signal corresponding to order number of the generation polynomial expression having non-zero coefficients is output th the code synchronization dedicated threshold value judgment circuit 525. In the shown embodiment, the outputs of the syndrome series S1 and the fifth, second and zeroth syndrome registers are output to the code synchronization dedicated threshold value judgment circuit 525.

The code synchronization dedicated threshold value judgment circuit 525 makes judgment that error is caused when number of signals having value "1" is greater than the threshold value, to output "1" as the error value ES. When number of signals having value "1" is less than the threshold value, judgment is made that error is not caused to output "0" as the error value ES.

The error value ES is output to the error detection counter 524 to count number of errors detected within the given period. The counted error count value EC is output to the code synchronization and serial/parallel conversion circuit 4 (step S28 of FIG. 22).

In another embodiment of the present invention, the threshold value of the code synchronization dedicated threshold value judgment circuit 525 is 3 and the threshold value of the threshold value judgment circuit 523 is 4, for example, in comparison with the method counting the error number on the basis of the error value E1 output by the threshold value judgment circuit 523, erroneous judgment of code synchronization and asynchronization can be reduced.

Subsequently, a further embodiment of the present invention will be discussed with reference to the drawings. In one embodiment of the present invention, the error value output from the threshold value judgment circuit in the first stage decoding circuit is fed back to correct syndrome series. Particularly, when error of the threshold value judgment circuit is detected, a process for inverting the syndrome series input to the threshold value judgment circuit is performed.

However, by performing inversion process of the syndrome series, number of registers storing "1" in the syndrome register can be reduced even when the code synchronization is not established. When number of registers in the syndrome register storing "1" is reduced, occurrence of judgment of error by the threshold value judgment circuit can be reduced to cause difficulty in discrimination of synchronized state and asynchronized state.

Therefore, in another embodiment of the present invention, in addition to the error value generating syndrome register and the threshold value judgment circuit, the syndrome register and the threshold value judgment circuit dedicated for code synchronization are provided to so as not to perform correction on the basis of the result of error judgment by the code synchronizing syndrome register.

Similarly to one embodiment of the present invention, operation and construction of another embodiment of the present invention will be discussed in terms that the coding ratio is 1/2, the code generating polynomial expression is foregoing (1), number of orthogonal is four and number or times of repetition of decoding is 2.

Another embodiment of the decoding circuit according to the present invention has similar construction as one embodiment of the present invention except that the syndrome register and the threshold value judgment circuit dedicated for code synchronization is provided in the error value generation circuit 52 in the first stage decoding circuit 5, and a method not to perform correction on the basis of the result of error judgment in the code synchronizing syndrome register. In the following discussion, the reference numerals similar to one embodiment of the present invention are used.

Figure 23:
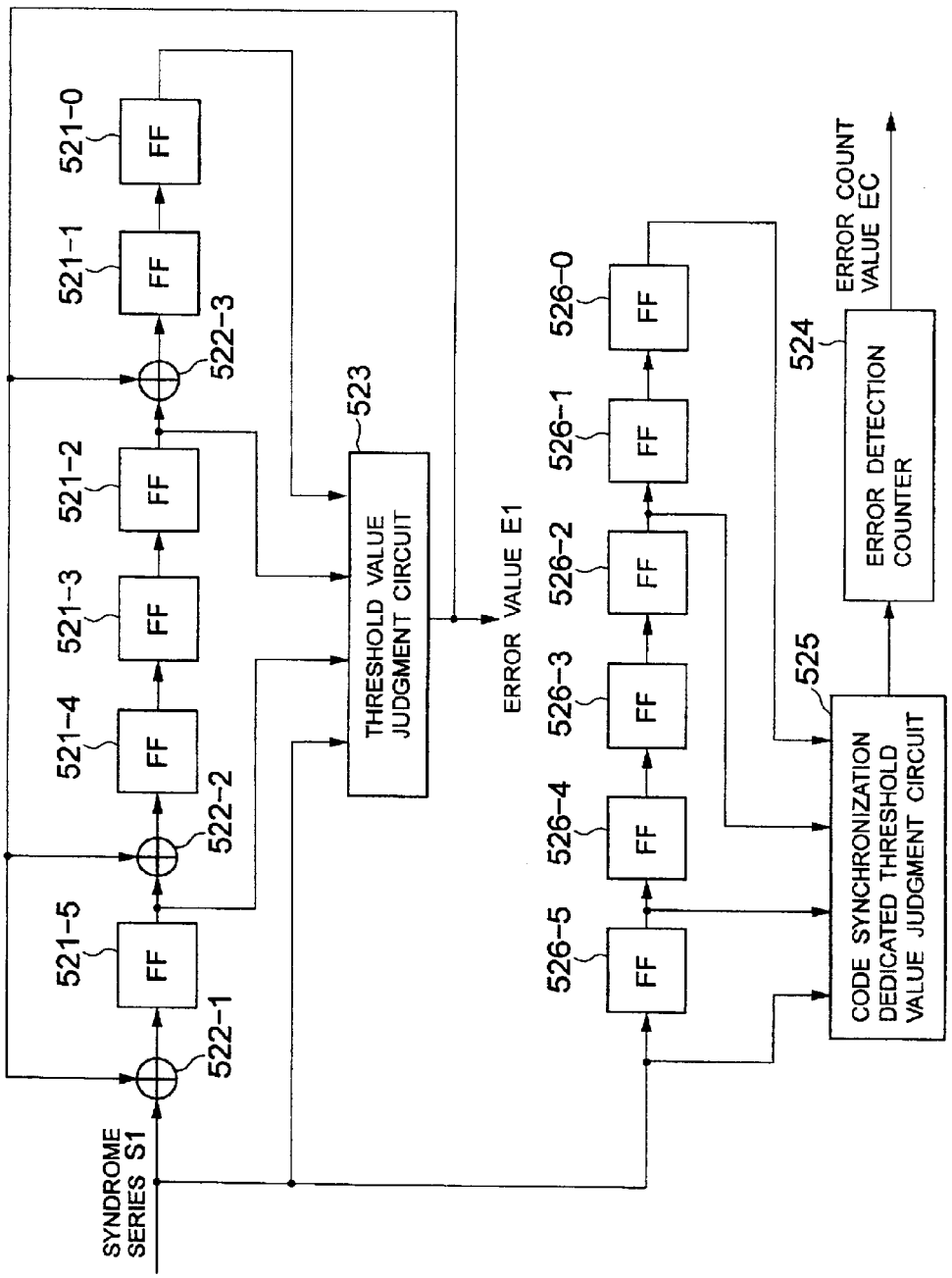
FIG. 23 is a block diagram showing a construction of the error value generation circuit in a further embodiment of the first stage decoding circuit according to the present invention.

FIG. 23 is a block diagram showing a construction of the error value generation circuit in a further embodiment of the first stage decoding circuit according to the present invention. In FIG. 23, the error value generation circuit 52 in another embodiment of the present invention is constructed with zeroth to fifth syndrome registers 521-0 to 521-5, the threshold value judgment circuit 523, the error detection couter 524, code synchronization dedicated threshold value judgement circuit 525, the zeroth to fifth code synchronization dedicated syndrome registers 526-0 to 526-5.

FIG. 24 is a flowchart showing a decoding process in a further embodiment of the first stage decoding circuit according to the present invention. Decoding process in the first decoding circuit in another embodiment of the present invention will be discussed with reference to FIGS. 23 and 24. It should be noted that, in FIG. 24, process operation in steps 31 to 36 is similar to the process operation of steps 11 to 16 shown in FIG. 9. Therefore, discussion for the process operation will be eliminated from disclosure.

The syndrome series S2 is input to the fifth code synchronizing syndrome register 526-5 to shift to lower order syndrome register at every occurrence of clock (step S37 of FIG. 24). Order number of syndrome register corresponds to order number of generation polynomial expression. The syndrome series S2 corresponds to sixth order.

The signals corresponding to order number of the generation polynomial expression having non-zero coefficients output to the code synchronization dedicated threshold value judgment circuit 525. In case of the shown embodiment, the syndrome series S1 and outputs of the fifth, second and zeroth code synchronization dedicated syndrome registers are output to the code synchronization dedicated threshold value judgment circuit 525. The code synchronization dedicated threshold value judgment circuit 525 makes judgment that error is caused when the number of signals having value "1" is greater than or equal to the threshold value to output "1" as error value ES. When the number of signals having value "1" is less than the threshold value, judgment that error is not caused, is made to output "0" as the error value ES (step S38 of FIG. 24).

The error value ES is output to the error detection counter 524 to count the error number detected within the given period. The error count value EC thus counted is output to the code synchronization and serial/parallel conversion circuit 4 (step S39 of FIG. 24). The syndrome series input to the code synchronization dedicated threshold value judgment circuit 525 is not corrected on the basis of result of error judgment to make erroneous judgment of code synchronization and a synchronization small.

As set forth above, according to the present invention, some of the syndrome bits determined by only error of the reception series is output in the self orthogonal code decoding circuit performing decoding for the self orthogonal code as convolution code to have parity check sum orthogonal to information bit of the block at a timing 0, decoding for self orthogonal code is repeated for a plurality of times to realize self orthogonal code decoding with simple circuit construction to significantly improve error correction performance.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A self orthogonal code decoding circuit for decoding a self orthogonal code and repeating decoding of said self orthogonal code for a plurality of times, using a plurality of decoding stages, wherein for each of said plurality of stages, a reception series error detection threshold value for detecting a reception series error is set to a predetermined value and in a first decoding stage, said reception series error detection threshold value is set high for detecting a reception series error only if there is a high probability of error and the threshold values are gradually lowered in each successive decoding stage, for error detection when there is a lower probably of error.

2. A self orthogonal code decoding circuit as set forth in claim 1, which comprises a code synchronization dedicated error detection circuit provided separately from a circuit for said reception series error detection for detecting a synchronization error on the basis of a threshold value optimized for code synchronization error detection, said code synchronization dedicated error detection threshold value being lower than said reception series error detection threshold value.

3. A self orthogonal code decoding circuit as set forth in claim 2, which comprises a syndrome register which shifts said syndrome bit to said code synchronization dedicated error detection circuit, so as not to perform reception series error correction on the basis of the result of error detection by said code synchronization dedicated error detection circuit.

4. A self orthogonal code decoding circuit as set forth in claim 1, which comprises means for performing a code synchronization error detection by counting the number of detected reception series errors and performing code synchronization error detection on the basis of the counted number of detected errors.

5. A self orthogonal code decoding circuit as set forth in claim 4, wherein each decoding circuit in said plurality of stages comprises:

a syndrome generation means for generating said syndrome bit;

an error value generation means for generating an error value by detecting an error of said syndrome bit generated by said syndrome generation means, on the basis of said reception series error detection threshold value an error correcting means for correcting an error of said syndrome bit on the basis of said error value generated by said error value generation means; and an error detection counter for counting errors on the basis of said error value generated by said error value generation means.

6. A self orthogonal code decoding circuit as set forth in claim 1, in a system including an information source generating an information series, an encoder for converting said information series into a code series, and a communication path for transmitting said code series.

7. A self orthogonal code decoding circuit as set forth in claim 6, wherein said communication path is a transmission path in radio communication.

8. A self orthogonal code decoding circuit as set forth in claim 6, wherein said communication path is constructed with a wired cable.

9. A self orthogonal code decoding circuit as set forth in claim 8, wherein said wired cable is an optical cable.

10. A self orthogonal code decoding circuit for decoding for a self orthogonal code on the basis of a syndrome bit determined by an error in a reception series which was generated from a transmission series, which was in turn generated by a parallel/serial conversion and by adding a check series to an information series, comprising:

a plurality of decoding circuit stages for repeating decoding of said self orthogonal code a plurality of times; and a check series register output provided from each decoding circuit stage except from a final decoding circuit stage, for inputting said check series to the next decoding circuit stage with a delay.

11. A self orthogonal code decoding method for decoding of a self orthogonal code and repeating decoding of said self orthogonal code a plurality of times, using a plurality of decoding stages, wherein for each of said plurality of stares, a reception series error detection threshold value for detecting a reception series error is set to a predetermined value and in a first decoding stage, said reception series error detection threshold value is set high for detecting a reception series error only if there is a high probability of error and the threshold values are gradually lowered in each successive decoding stage, for error detection when there is a lower probably of error.

12. A self orthogonal code decoding method as set forth in claim 11, which comprises means for performing code synchronization error detection by counting the number of detected reception series errors and performing code synchronization error detection on the basis of the counted number of errors.

13. A self orthogonal code decoding method as set forth in claim 12, which includes generating said syndrome bit, generating an error value by detecting an error of said syndrome bit generated by said syndrome generation means on the basis of said reception series error detection threshold value, correcting the error of said syndrome bit on the basis of said error value generated by said error value generation means;

and counting said error number on the basis of said error value generated by said error value generation means.

14. A self orthogonal code decoding method as set forth in claim 12, wherein a threshold value of a code synchronization dedicated error detection circuit is provided separately from the circuit for reception series error detection and dedicated to code synchronization error detection on the basis of a threshold value optimized for code synchronization error detection being set lower than said reception series error detection threshold value.

15. A self orthogonal code decoding method as set forth in claim 14, which comprises a step of providing a syndrome register which shifts said syndrome bit to said code synchronization dedicated error detection circuit, so not to perform reception series error correction on the basis of the result of error detection by said code synchronization dedicated error detection circuit.

16. A self orthogonal code decoding method as set forth in claim 11, in a system including an information source for generating an information series, an encoder for converting said information series into a code series, and a communication path for transmitting said code series.

17. A self orthogonal code decoding method as set forth in claim 16, wherein said communication path is a transmission path in radio communication.

18. A self orthogonal code decoding method as set forth in claim 16, wherein said communication path is constructed with a wired cable.

19. A self orthogonal code decoding method as set forth in claim 18, wherein said wired cable is an optical cable.

20. A self orthogonal code decoding method for decoding a self orthogonal code on the basis of a syndrome bit determined by an error in a reception series which was generated from a transmission series which was in turn generated by a parallel/serial conversion and by adding a check series to an information series, comprising a step of:

in each of a plurality of decoding circuit stages for repeating decoding of said self orthogonal code for a plurality of times, said check series is input to a next decoding circuit stage with a delay, except from the final decoding circuit stage.

* * * * *